US007760497B2

(12) United States Patent
Eddy et al.

(10) Patent No.: US 7,760,497 B2
(45) Date of Patent: Jul. 20, 2010

(54) POWERED CONTROLLED ACCELERATION SUSPENSION WORK PLATFORM HOIST CONTROL COOLING SYSTEM

(75) Inventors: Robert E. Eddy, Johnstown, OH (US); Gary E. Ingram, New Albany, OH (US)

(73) Assignee: Sky Climber LLC, Delaware, OH (US)

( * ) Notice: Subject to any disclaimer, the term of this patent is extended or adjusted under 35 U.S.C. 154(b) by 367 days.

(21) Appl. No.: 12/017,271

(22) Filed: Jan. 21, 2008

(65) Prior Publication Data

US 2008/0174955 A1 Jul. 24, 2008

Related U.S. Application Data

(63) Continuation-in-part of application No. 11/267,629, filed on Nov. 4, 2005, now Pat. No. 7,631,730.

(51) Int. Cl.
*H05K 7/20* (2006.01)

(52) U.S. Cl. .................. 361/688; 361/601; 361/679.01; 361/697; 361/704; 62/129; 62/236; 60/324; 294/1.1; 182/148; 187/296

(58) Field of Classification Search ................. 361/600, 361/601, 676, 679.01, 695, 697, 701, 704
See application file for complete search history.

(56) References Cited

U.S. PATENT DOCUMENTS 5,871,249 A * 2/1999 Williams ................. 294/86.41
6,445,580 B1 * 9/2002 Cohen et al. ........... 361/679.47
6,499,306 B2 * 12/2002 Gillen ......................... 62/129
6,822,861 B2 * 11/2004 Meir .......................... 361/695
6,822,866 B2 * 11/2004 Fearing et al. .............. 361/701
2001/0017035 A1 * 8/2001 Sada et al. ...................... 62/99
2005/0146850 A1 * 7/2005 Meir .......................... 361/687

* cited by examiner

*Primary Examiner*—Jayprakash N Gandhi
*Assistant Examiner*—Courtney Smith
(74) *Attorney, Agent, or Firm*—Gallagher & Dawsey Co., LPA; Michael J. Gallagher; David J. Dawsey

(57) ABSTRACT

The hoist control cooling system for preferentially cooling components of a variable frequency drive that is controlling a hoist motor. The cooling system includes an inverter temperature sensor, an ambient temperature sensor, a cooling system controller, an inverter cooler, and an ambient cooler. The inverter temperature sensor measures the temperature of the inverter and generates an inverter temperature signal. The ambient temperature sensor measures the temperature of the ambient air in the sealed control enclosure and generates an ambient temperature signal. The cooling system controller communicates with the inverter temperature sensor and the ambient temperature sensor by receiving the inverter temperature signal, the ambient temperature signal, and generating both an inverter cooling signal, and an ambient cooling signal. The inverter cooling signal controls the cooling of the inverter. Similarly, an ambient cooling signal switches the ambient cooler on, thereby cooling the ambient air temperature in the sealed control enclosure.

20 Claims, 15 Drawing Sheets

POWERED CONTROLLED ACCELERATION SUSPENSION WORK PLATFORM HOIST CONTROL COOLING SYSTEM

REFERENCE TO RELATED DOCUMENTS

This application is a continuation-in-part of a previous application filed in the United States Patent and Trademark Office on Nov. 4, 2005 now U.S. Pat. No. 7,631,730, titled "Powered Controlled Acceleration Suspension Work Platform Hoist System," and given Ser. No. 11/267,629, all of which is incorporated here by reference as if completely written herein.

TECHNICAL FIELD

The instant invention relates to powered suspended work platform hoist system, particularly a system that controls the acceleration of a suspended work platform and the cooling of the associated controls.

BACKGROUND OF THE INVENTION

Suspension type work platforms, also commonly referred to as access platforms, are well-known in the art. Such platforms are typically powered by a hoist at each end of the platform that raises and lowers the platform on an associated suspension wire at each end. The hoists are generally very simple machines including an electric motor, a gearbox, and a traction mechanism that grips the wire. Generally the electric motors are single-speed motors; however two-speed motors are available. Traditionally the motors incorporate across-the-line starters and therefore switch from off to full speed at the press of a button. The gearboxes reduce the motor speed resulting in a platform velocity generally ranging from 27 feet per minute (fpm) to 35 fpm. Therefore, the acceleration of the work platform from standing to 27 fpm, or more, essentially instantaneously is jarring and dangerous, not only to the occupants but also the roof beams, or anchorage points.

Similarly, traditional systems offer no control over a powered deceleration of the work platform. This is particularly problematic when trying to stop the work platform at a particular elevation since the platform approaches the elevation at full speed and then stops instantaneously. This crude level of control offered by traditional systems results in repeated starting, stopping, and reversing, or "hunting," before the desired elevation is obtained. Such repeated starts and stops not only prematurely wear the equipment, but are dangerous to the work platform occupants.

What has been missing in the art has been a system by which the users, employers, or equipment manufacturers can control the acceleration of the work platform. Further, a system in which the velocity can be adjustably limited depending on the particular working conditions is desired.

SUMMARY OF INVENTION

In its most general configuration, the present invention advances the state of the art with a variety of new capabilities and overcomes many of the shortcomings of prior devices in new and novel ways. In its most general sense, the present invention overcomes the shortcomings and limitations of the prior art in any of a number of generally effective configurations. The instant invention demonstrates such capabilities and overcomes many of the shortcomings of prior methods in new and novel ways.

The hoist control cooling system is comprised of a variable frequency drive in electrical communication with the constant frequency input power source, and includes a rectifier, a dc bus, and an inverter. The inverter contains electronic switching devices such as, but not limited to: Bipolar Junction Transistors (BJT), "Insulated Gate Bipolar Transistors" (IGBTs), "Silicon Control Rectifiers" (SCRs), and or Metal Oxide Semiconductor Field Effect Transistors. The electronic switching devices allow precision control of the power being delivered to the hoist motor.

The variable frequency drive however, generates substantial heat during usage. As such, a cooling system is required to keep the variable frequency drive within operating parameters. The cooling system includes an inverter temperature sensor, an ambient temperature sensor, a cooling system controller, an inverter cooler, and an ambient cooler. The inverter temperature sensor measures the temperature of the inverter and generates an inverter temperature signal. The ambient temperature sensor measures the temperature of the ambient air in the sealed control enclosure and generates an ambient temperature signal. The cooling system controller communicates with the inverter temperature sensor and the ambient temperature sensor by receiving the inverter temperature signal, the ambient temperature signal, and generating both an inverter cooling signal, and an ambient cooling signal. The inverter cooling signal controls the cooling of the inverter. Similarly, an ambient cooling signal switches the ambient cooler on, thereby cooling the ambient air temperature in the sealed control enclosure.

The inverter cooler is in physical contact with at least a portion of inverter and in physical contact with a portion of one of the plurality of enclosure sidewalls. The inverter cooler communicates with the cooling system controller which controls the amount of heat that the inverter cooler removes from the inverter and rejects to the enclosure sidewall. The ambient cooler is also located within the sealed control enclosure and receives the ambient cooling signal from the cooling system controller. The ambient cooling signal controls the amount of heat that the ambient cooler removes from the control enclosure.

The present invention includes numerous embodiments and alternative configurations. These variations, modifications, alternatives, and alterations of the various preferred embodiments may be used alone or in combination with one another, as will become more readily apparent to those with skill in the art with reference to the following detailed description of the preferred embodiments and the accompanying figures and drawings.

BRIEF DESCRIPTION OF THE DRAWINGS

Without limiting the scope of the present invention as claimed below and referring now to the drawings and figures:

DETAILED DESCRIPTION OF THE INVENTION

The powered controlled acceleration suspension work platform hoist system (10) of the instant invention enables a significant advance in the state of the art. The preferred embodiments of the device accomplish this by new and novel arrangements of elements and methods that are configured in unique and novel ways and which demonstrate previously unavailable but preferred and desirable capabilities. The detailed description set forth below in connection with the drawings is intended merely as a description of the presently preferred embodiments of the invention, and is not intended to represent the only form in which the present invention may be constructed or utilized. The description sets forth the designs, functions, means, and methods of implementing the invention in connection with the illustrated embodiments. It is to be understood, however, that the same or equivalent functions and features may be accomplished by different embodiments that are also intended to be encompassed within the spirit and scope of the invention.

Figure 16:
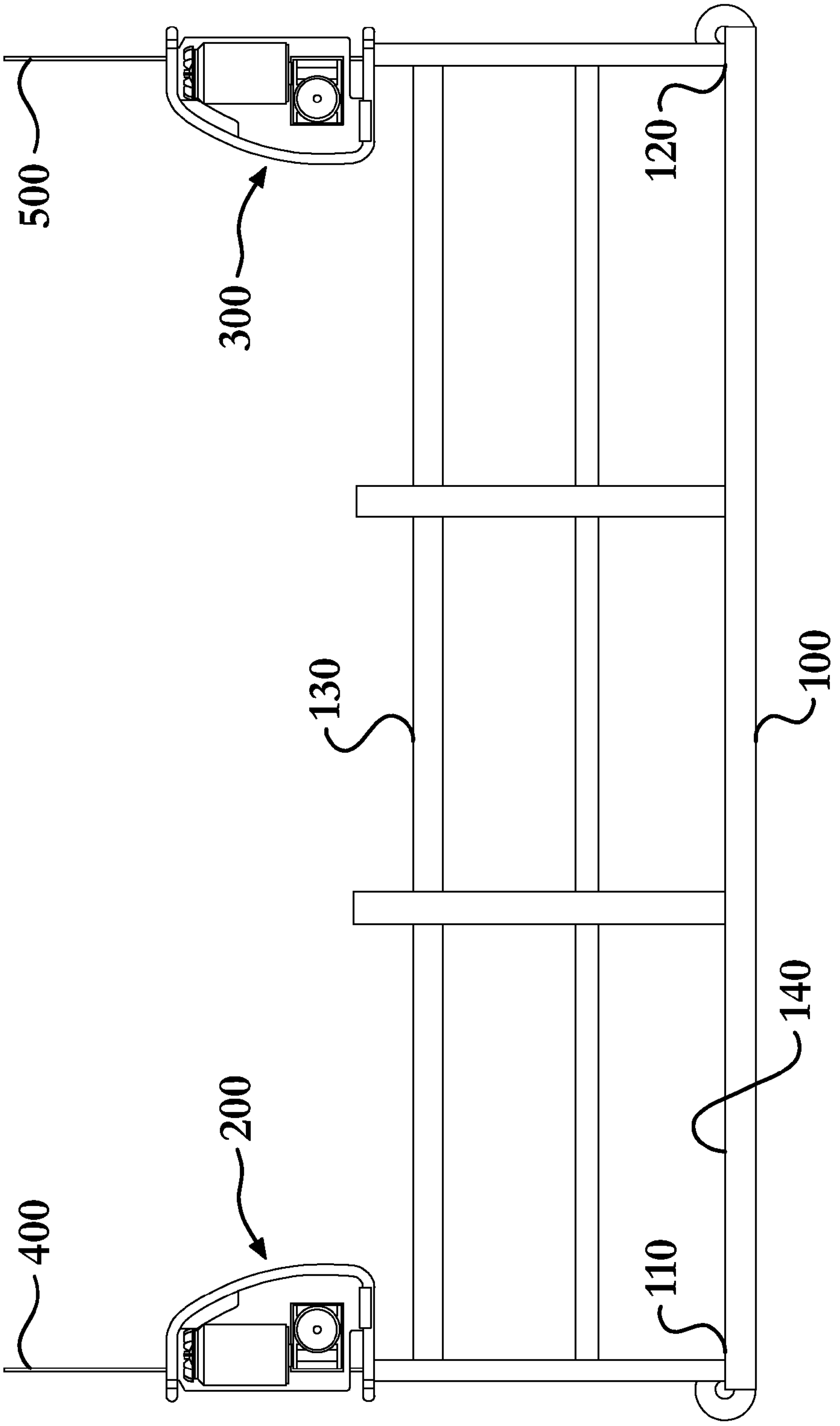
FIG. 16 is a front elevation view of a work platform.

The present invention is a powered controlled acceleration suspension work platform hoist system (10) for raising and lowering a work platform (100) at a predetermined acceleration. As seen in FIG. 16, the work platform (100) is raised and lowered on two wire ropes, namely a sinistral rope (400) and a dextral rope (500). Additionally, the work platform (100) has a sinistral end (110) and a dextral end (120). The powered controlled acceleration suspension work platform hoist system (10) includes a sinistral hoist (200) that is releasably attached to the work platform (100) near the sinistral end (110) and cooperates with the sinistral rope (400), and a dextral hoist (300) that is releasably attached to the work platform (100) near the dextral end (110) and cooperates with the dextral rope (500). Now, referring to FIGS. 10-15, the sinistral hoist (200) has a sinistral motor (210) and the dextral hoist (300) has a dextral motor (310), and both motors (210, 310) are in electrical communication with a variable acceleration motor control system (600). While FIGS. 10-15 illustrate only the sinistral hoist (200) and its components, the same figures apply equally to the dextral hoist (300) since they are identical, merely substituting 300 series element numbers in place of the 200 series element numbers.

Figure 1:
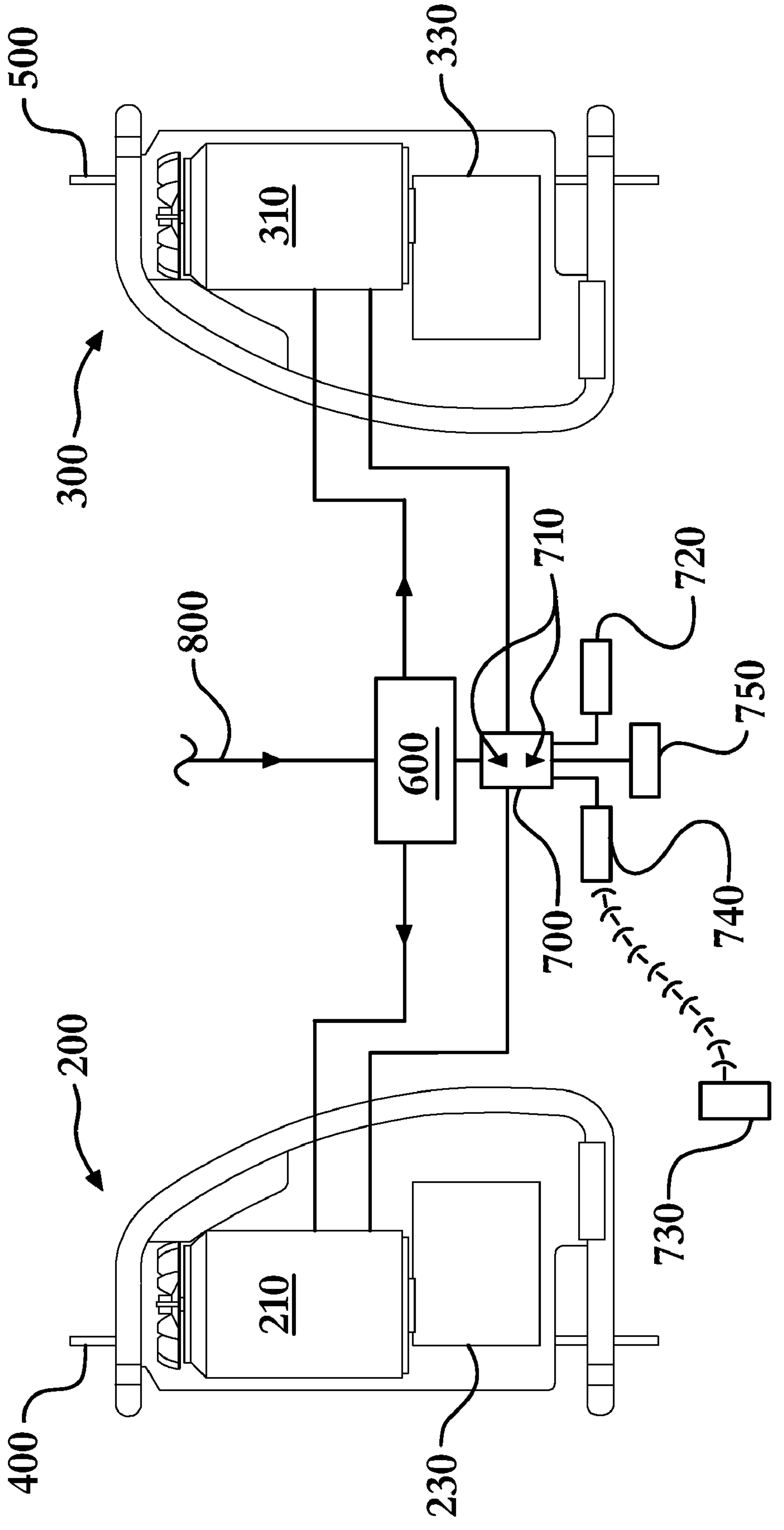
FIG. 1 is a schematic of the suspension work platform hoist system of the present invention, not to scale.

With reference now to FIG. 1, the variable acceleration motor control system (600) is releasably attached to the work platform (100) and is in electrical communication with a constant frequency input power source (800) and the sinistral motor (210) and the dextral motor (310).

The variable acceleration motor control system (600) controls the acceleration of the work platform (100) as the work platform (100) is raised and lowered on the sinistral rope (400) and the dextral rope (500) by controlling the sinistral motor (210) and the dextral motor (310). Lastly, the powered controlled acceleration suspension work platform hoist system (10) includes a platform control system (700) releasably attached to the work platform (100) and in electrical communication with the variable acceleration motor control system (600), the sinistral motor (210), and the dextral motor (300), and has a user input device (710) designed to accept instructions to raise or lower the work platform (100).

Figure 11:
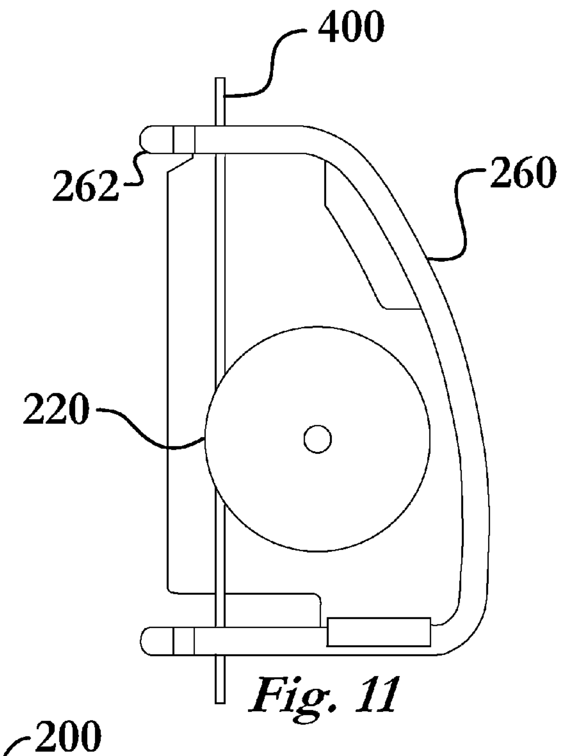
FIG. 11 is a right side elevation view of a hoist of the present invention, not to scale.
Figure 12:
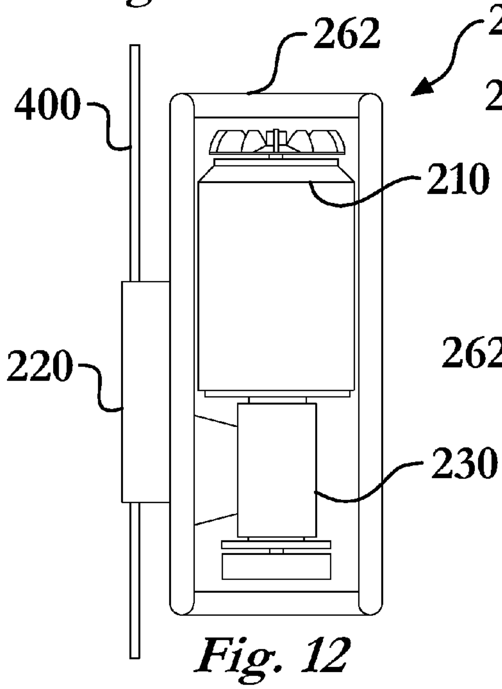
FIG. 12 is a rear elevation view of a hoist of the present invention, not to scale.
Figure 13:
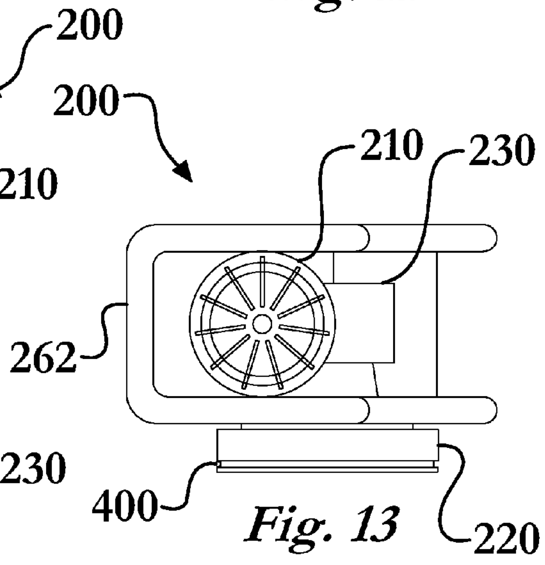
FIG. 13 is a top plan view of a hoist of the present invention, not to scale.

In addition to the sinistral motor (210), the sinistral hoist (200) has a sinistral traction mechanism (220), seen best in FIGS. 11-12, designed to cooperate with the sinistral rope (400), and a sinistral gearbox (230) for transferring power from the sinistral motor (210) to the sinistral traction mechanism (220). Similarly, the dextral hoist (300) has a dextral traction mechanism (320) designed to cooperate with the dextral rope (300), and a dextral gearbox (330) for transferring power from the dextral motor (310) to the dextral traction mechanism (320). The sinistral hoist (220) is releasably attached to the work platform (100) near the sinistral end (110) and the dextral hoist (320) is releasably attached to the work platform (100) near the dextral end (120). The work platform (100) includes a floor (140) and a railing (130), as seen in FIG. 16.

Referring again to FIG. 1, the variable acceleration motor control system (600) is in electrical communication with the constant frequency input power source (800). Such a power source may be any of the conventional alternating current power sources used throughout the world, including, but not limited to, single phase, as well as three phase, 50 Hz, 60 Hz, and 400 Hz systems operating at 110, 120, 220, 240, 380, 480, 575, and 600 volts. The variable acceleration motor control system (600) controls the rate at which the sinistral motor (210) accelerates the sinistral traction mechanism (220) and the rate at which the dextral motor (310) accelerates the dextral traction mechanism (320) thereby controlling the acceleration of the work platform (100) as the work platform (100) is raised and lowered on the sinistral rope (400) and the dextral rope (500).

The variable acceleration motor control system (600) not only controls the acceleration of the work platform (100) in the conventional sense of positive acceleration, but it also controls the negative acceleration, or deceleration, of the work platform (100). Such control not only eliminates bone jarring starts and stops characteristic of single-speed and two-speed hoists, but also provides the ability to slowly approach a particular elevation, from above or below, in a controlled fashion so that the elevation is not passed, or overshot. In fact, in one embodiment the variable acceleration motor control system (600) includes an approach mode having an adjustable approach velocity setpoint which limits the velocity of the work platform (100) to a value of fifty percent, or less, of the maximum velocity.

The variable acceleration motor control system (600) provides the user the ability to control the acceleration and set a particular working velocity of the work platform (100). For example, if the work platform (100) is being used for window washing then the work platform (100) is being advanced relatively short distances at a time, typically 10-12 feet, as the work platform (100) is moved from floor to floor. In such a situation there is no need to allow the work platform (100) to accelerate to the maximum velocity when advancing a floor at a time. Therefore, in one embodiment the variable acceleration motor control system (600) permits the establishment of an adjustable maximum working velocity, which is a great safety improvement because advancing from floor to floor at a controlled working velocity that is a fraction of the maximum velocity reduces the likelihood of accidents.

Such a system still allows the user to command the variable acceleration motor control system (600) to accelerate to the maximum velocity when traversing more significant distances. Therefore, the variable acceleration motor control system (600) controls the acceleration of the work platform (100) so that the work platform (100) reaches a maximum velocity in no less than a predetermined time period to eliminate the bone jarring starts previously discussed as being associated with single-speed and two-speed hoist systems. The time period is a minimum of 1 second, but is more commonly 2-5 seconds, or more, depending on the use of the work platform (100). For instance, greater time periods may be preferred when the work platform (100) is transporting fluids such as window washing fluids or paint.

Figure 2:
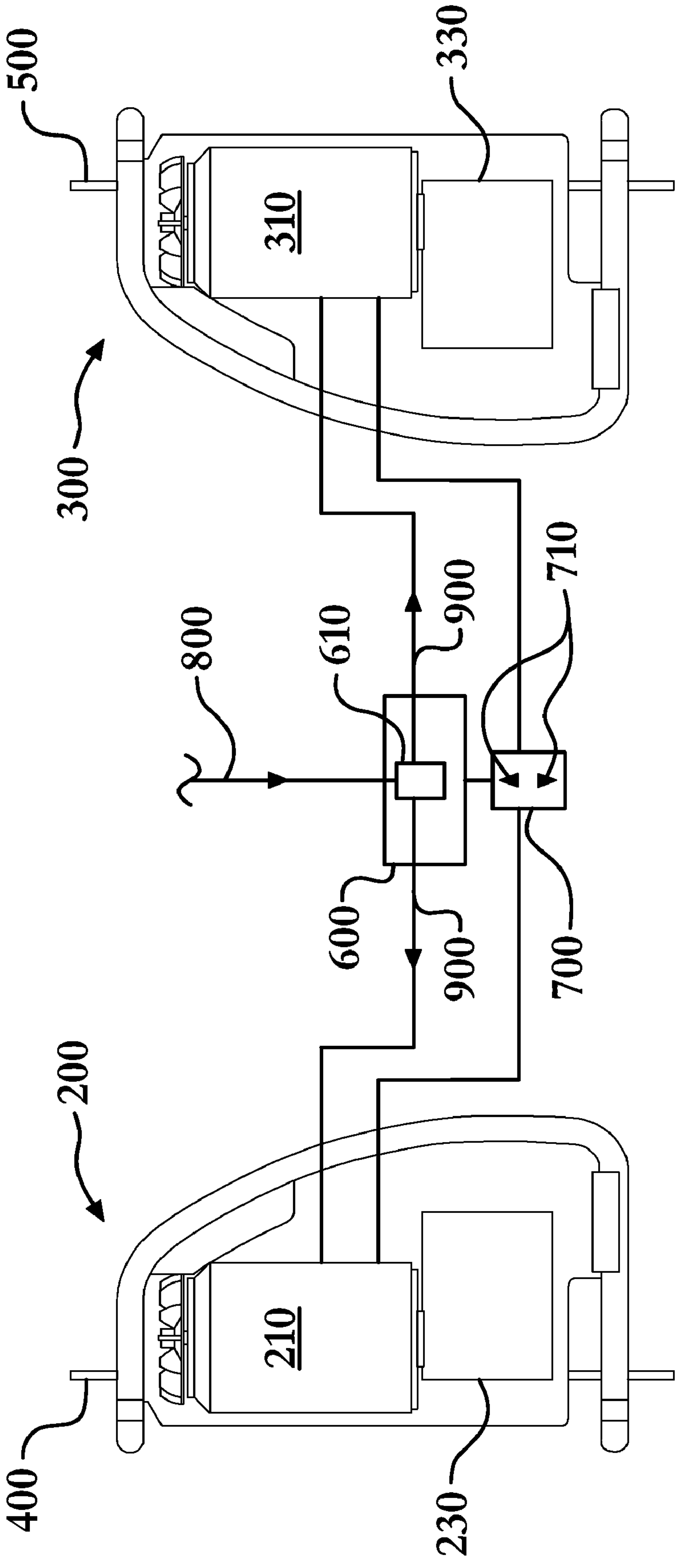
FIG. 2 is a schematic of the suspension work platform hoist system of the present invention, not to scale.

As previously mentioned, the variable acceleration motor control system (600) is in electrical communication with the constant frequency input power (800) and the sinistral motor (210) and dextral motor (310), as seen in FIG. 1. In one embodiment, the variable acceleration motor control system (600) achieves the acceleration control by converting the constant frequency input power to a variable frequency power supply (900) in electrical communication with the motors (210, 310), as seen in FIG. 2. In one particular embodiment the variable acceleration motor control system (600) includes a variable frequency drive (610) that converts the constant frequency input power source (800) to a variable frequency power supply (900) connected to the sinistral motor (210) and the dextral motor (310).

Figure 3:
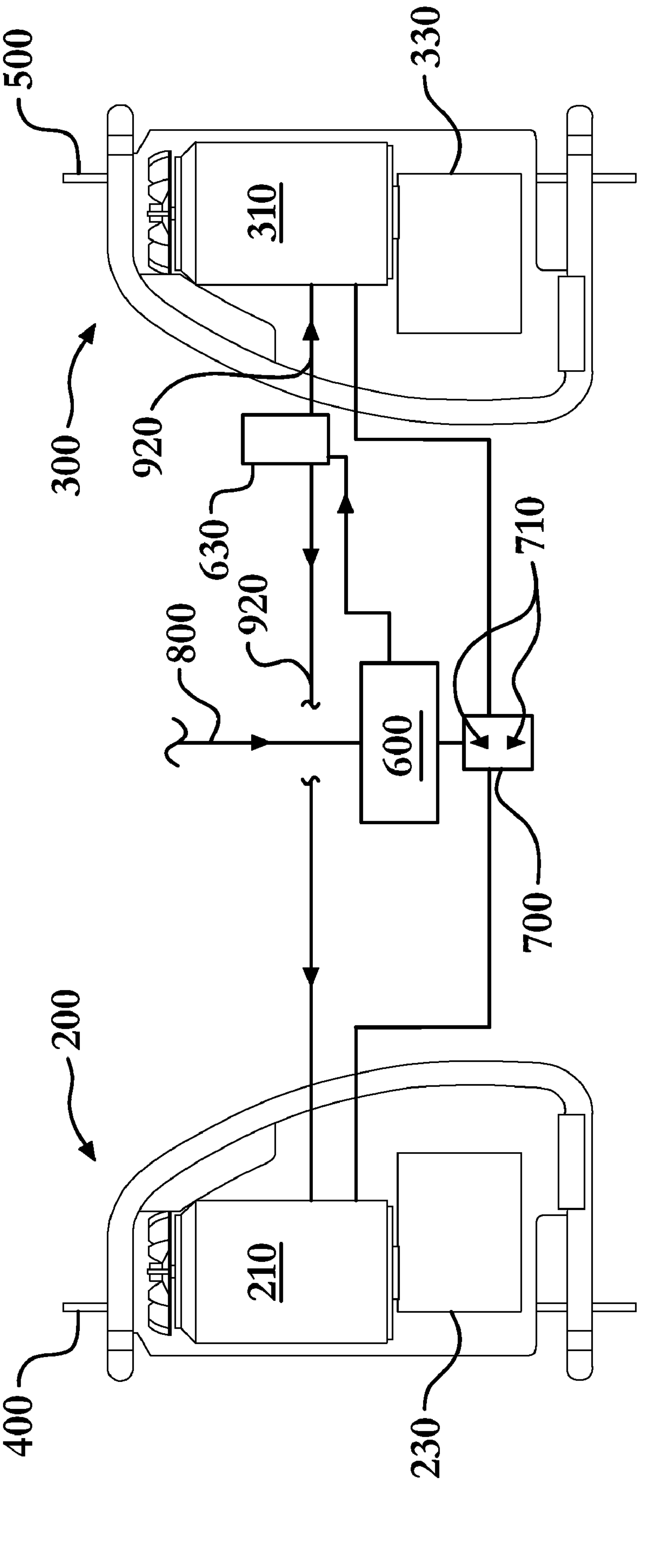
FIG. 3 is a schematic of the suspension work platform hoist system of the present invention, not to scale.
Figure 4:
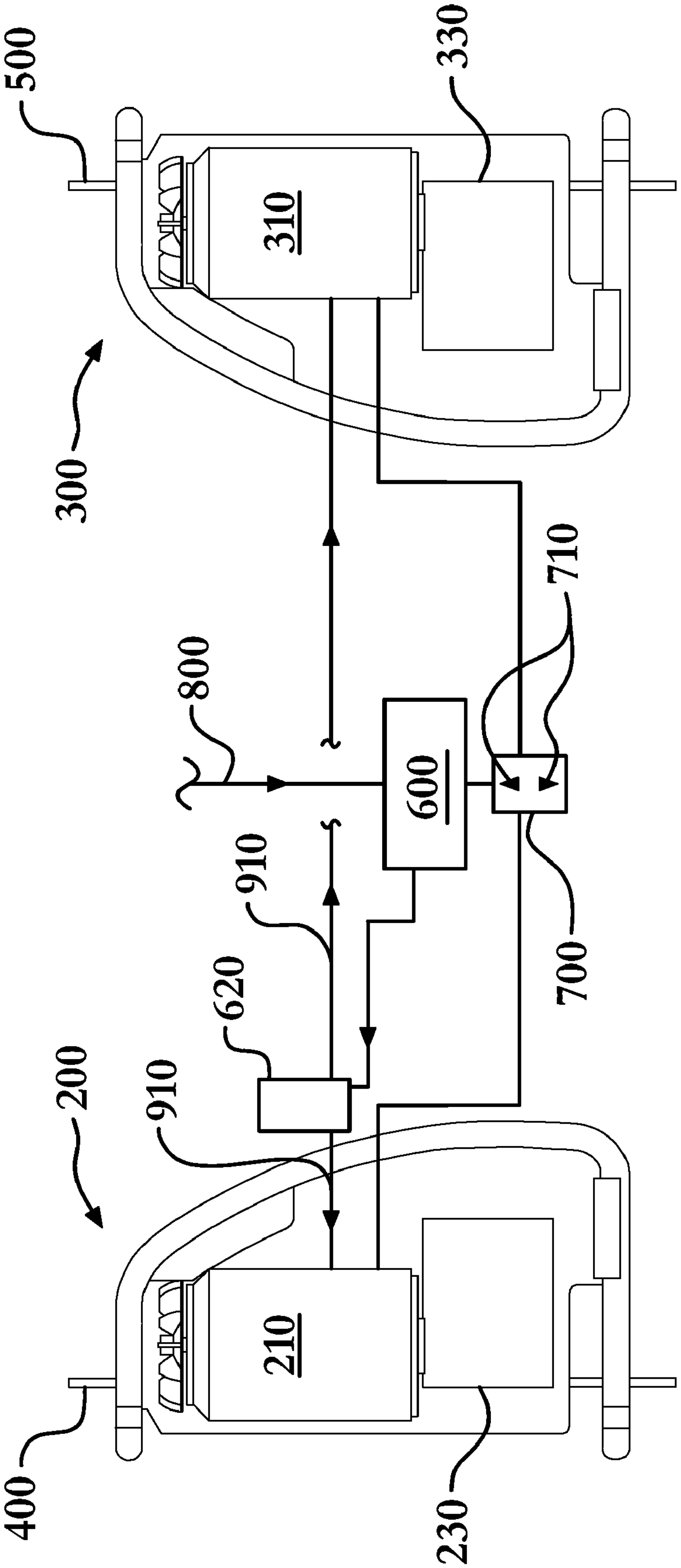
FIG. 4 is a schematic of the suspension work platform hoist system of the present invention, not to scale.

The variable frequency drive (610) embodiment may include a single variable frequency drive (610) to control both the sinistral motor (210) and the dextral motor (310). For example, a single sinistral variable frequency drive (620) may be incorporated to convert the constant frequency input power source (800) to a sinistral variable frequency power supply (910) in electrical communication with the sinistral motor (210) and the dextral motor (310) such that the sinistral motor (210) and the dextral motor (310) are powered in unison by the sinistral variable frequency power supply (910), as seen in FIG. 4. Alternatively, the variable acceleration motor control system (600) may include a dextral variable frequency drive (630) that converts the constant frequency input power source (800) to a dextral variable frequency power supply (920) in electrical communication with the sinistral motor (210) and a dextral motor (310) such that the sinistral motor (210) and the dextral motor (310) are powered in unison by the dextral variable frequency power supply, as seen in FIG. 3. Typically, the single variable frequency drive (610), whether it be the sinistral variable frequency drive (620) or the dextral variable frequency drive (630), is mounted within the body of either the sinistral hoist (200) or the dextral hoist (300), with the rest of the variable acceleration motor control system (600). Therefore, conductors connected to the constant frequency input power source (800) would connect to one of the hoists (200, 300) and power that particular variable frequency drive (610, 620) that would then provide a variable frequency power supply (910, 920) to both motors (210, 310), one with conductors merely connecting the variable frequency drive (610, 620) to the motor (210, 310) within the hoist (200, 300) and the other with conductors traversing the work platform (100) to connect to and power the other hoist (200, 300).

Figure 5:
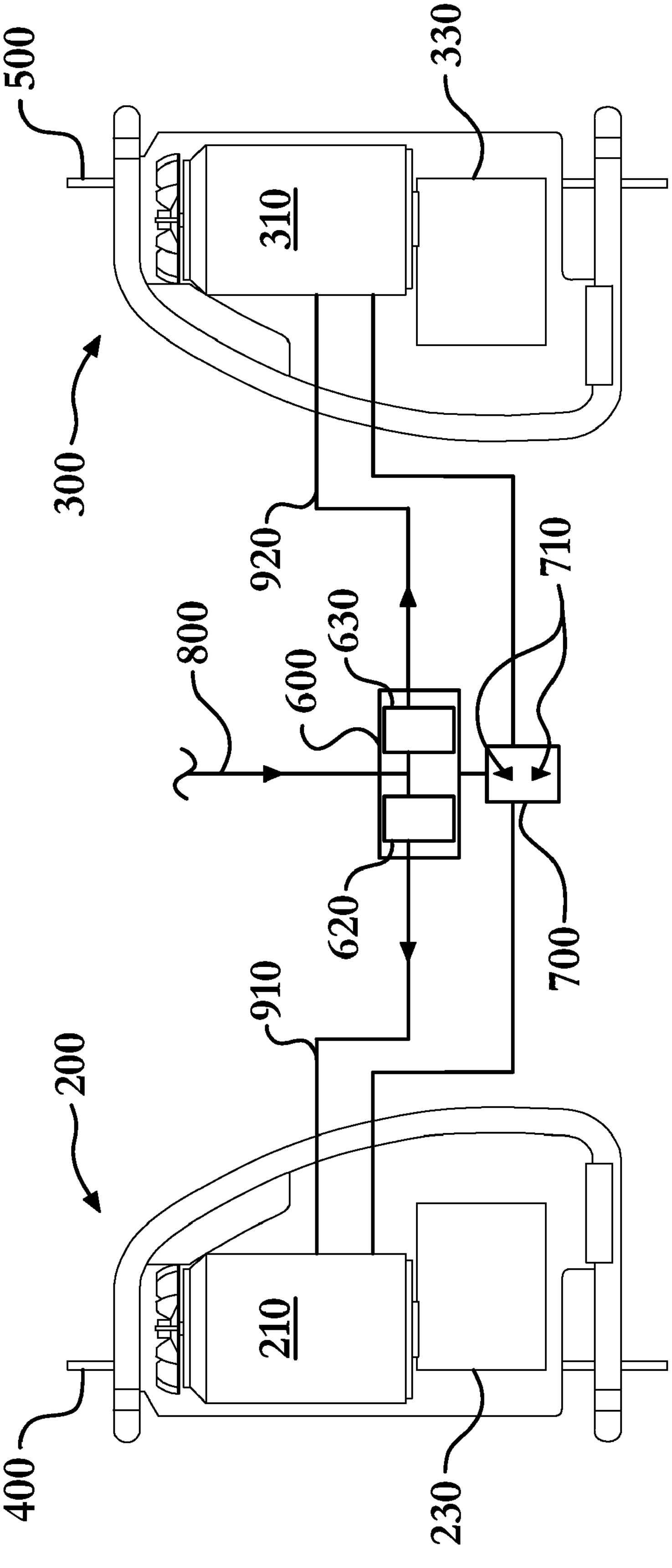
FIG. 5 is a schematic of the suspension work platform hoist system of the present invention, not to scale.
Figure 6:
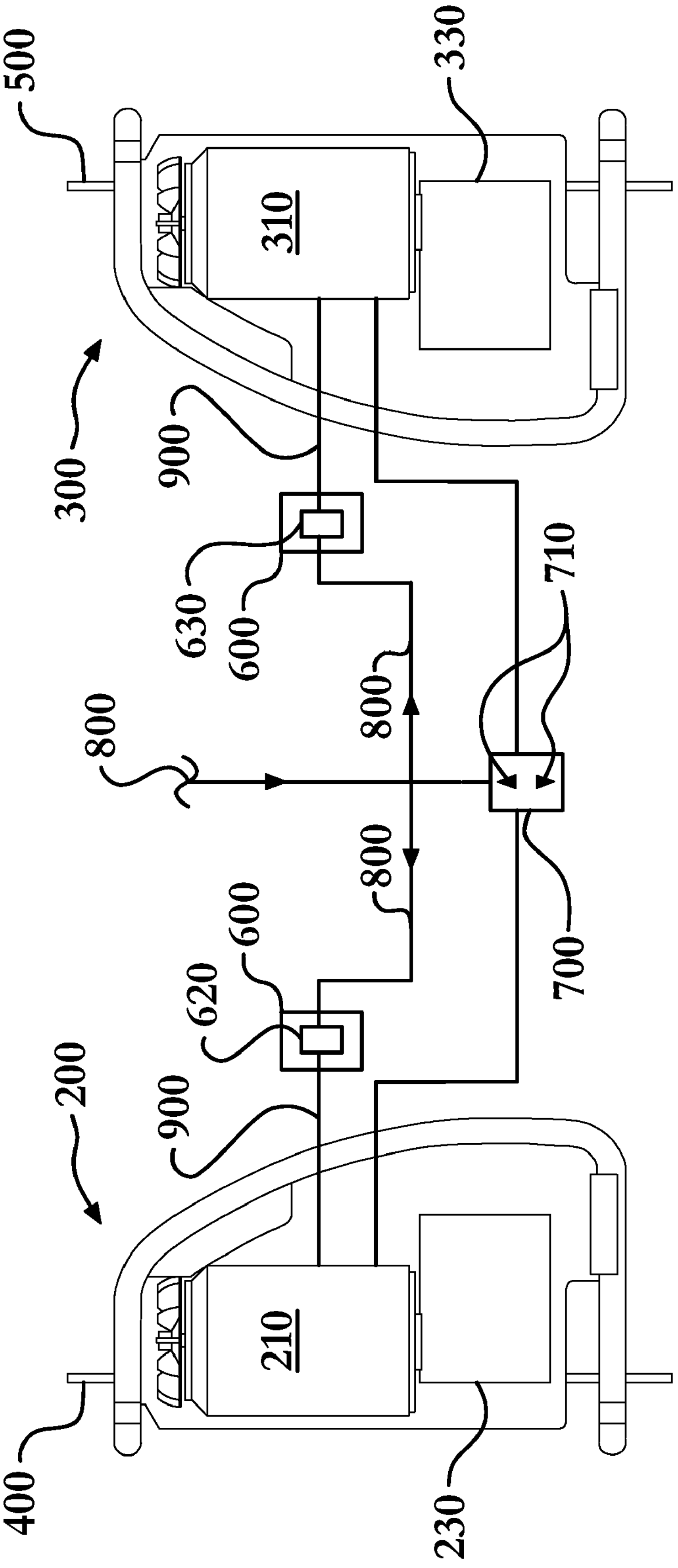
FIG. 6 is a schematic of the suspension work platform hoist system of the present invention, not to scale.

In an alternative variable frequency drive (610) embodiment both the sinistral motor (210) and the dextral motor (310) are associated with their own variable frequency drive, namely a sinistral variable frequency drive (620) and a dextral variable frequency drive (630), as seen in FIGS. 5 and 6. The variable frequency drives (620, 630) may be centrally housed, as seen in FIG. 5, or located at, or in, the individual hoists (200, 300), as seen in FIG. 6. In one embodiment each variable frequency drive (620, 630) powers only the associated motor (210, 310), as seen in FIGS. 5-6. In an alternative embodiment seen in FIGS. 7-9, the sinistral variable frequency drive (620) and a dextral variable frequency drive (630) are each sized to power both motors (210, 310) and never only power a single motor, thereby introducing a field configurable redundant output power supply capability. Referring first to the embodiment of FIG. 6 wherein the sinistral variable frequency drive (620) only powers the sinistral motor (210) and the dextral variable frequency drive (630) only powers the dextral motor (310), the two drives (620, 630) are still a part of the variable acceleration motor control system (600), regardless of the fact that each drive (620, 630) will most likely be housed within the associated hoist (200, 300), and therefore offer all of the previous described control benefits, and each drive (620, 630) may be controlled in unison with a common control signal.

Figure 7:
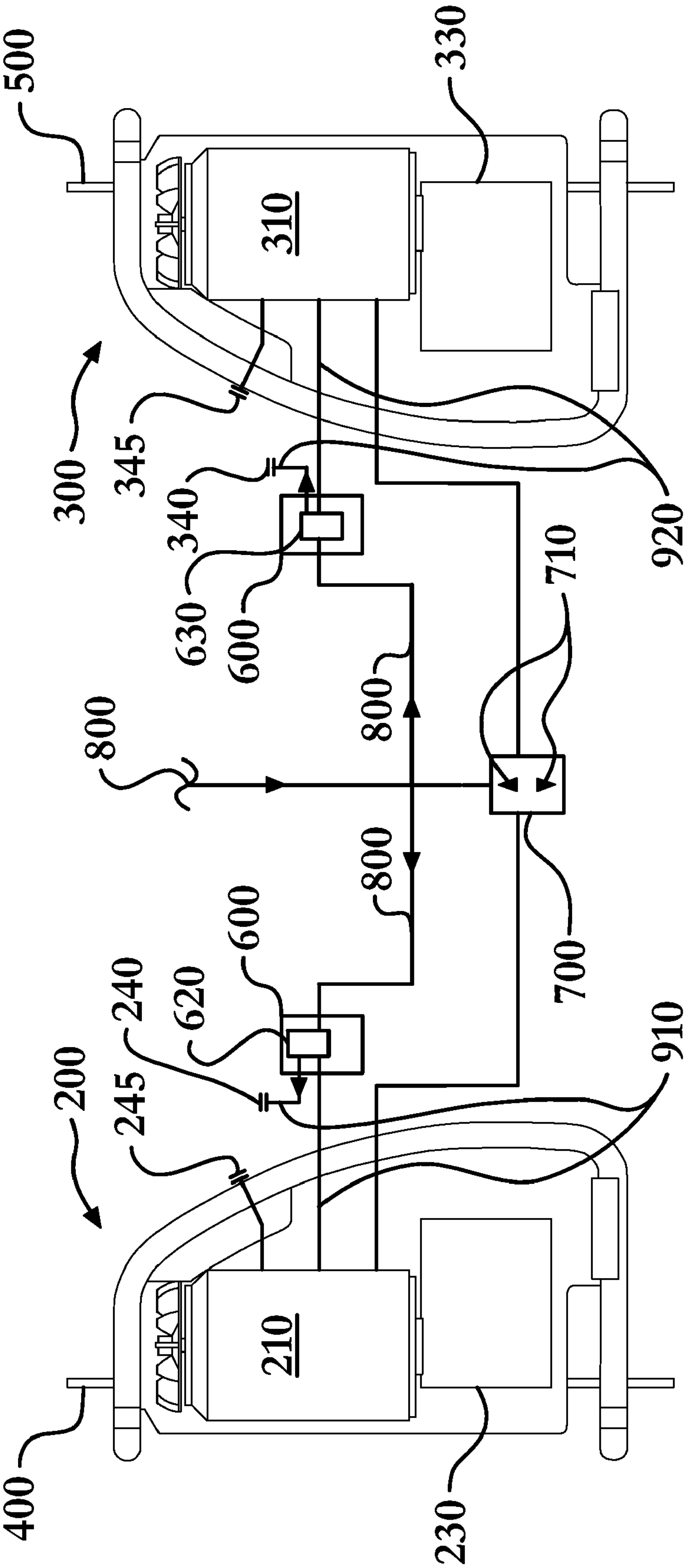
FIG. 7 is a schematic of the suspension work platform hoist system of the present invention, not to scale.
Figure 8:
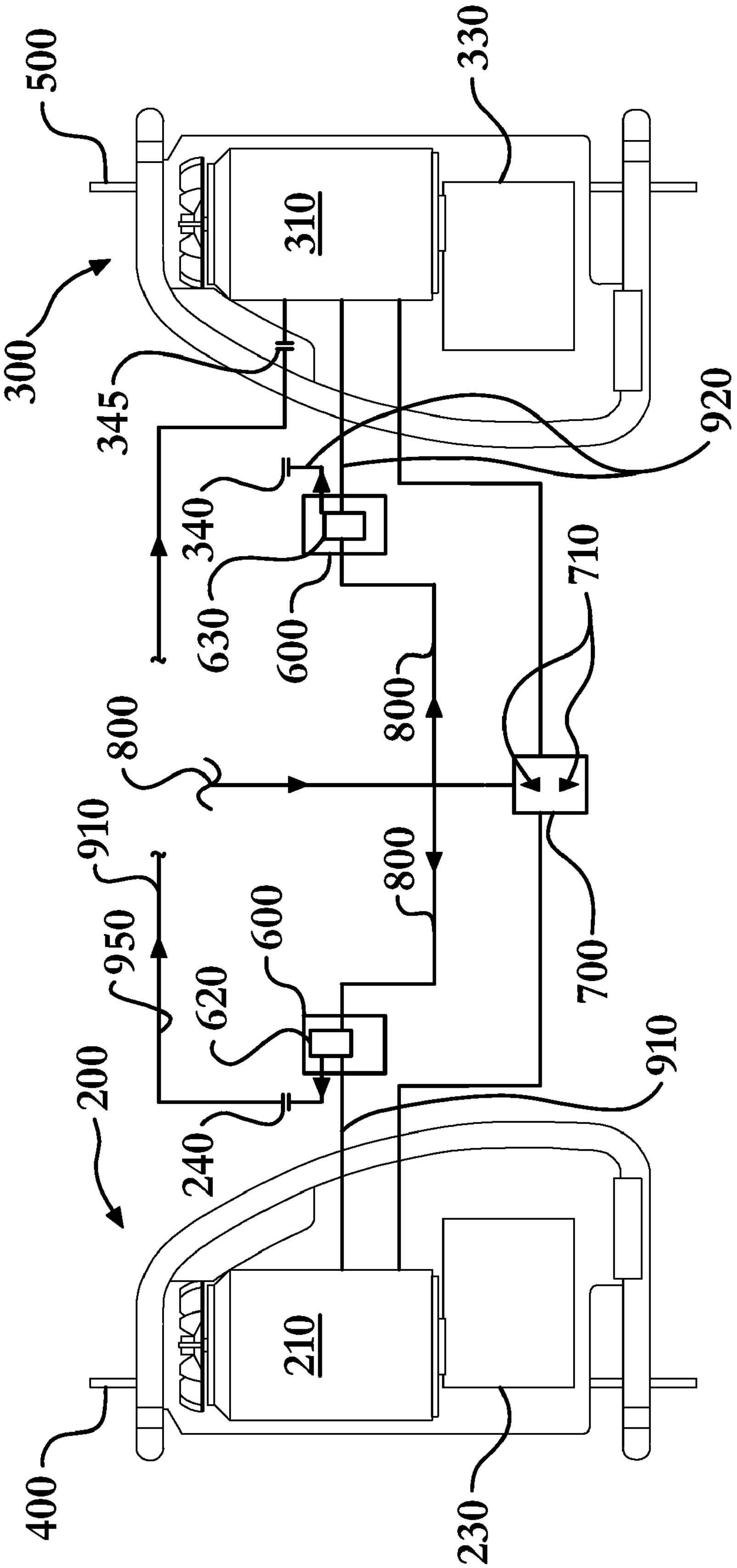
FIG. 8 is a schematic of the suspension work platform hoist system of the present invention, not to scale.
Figure 9:
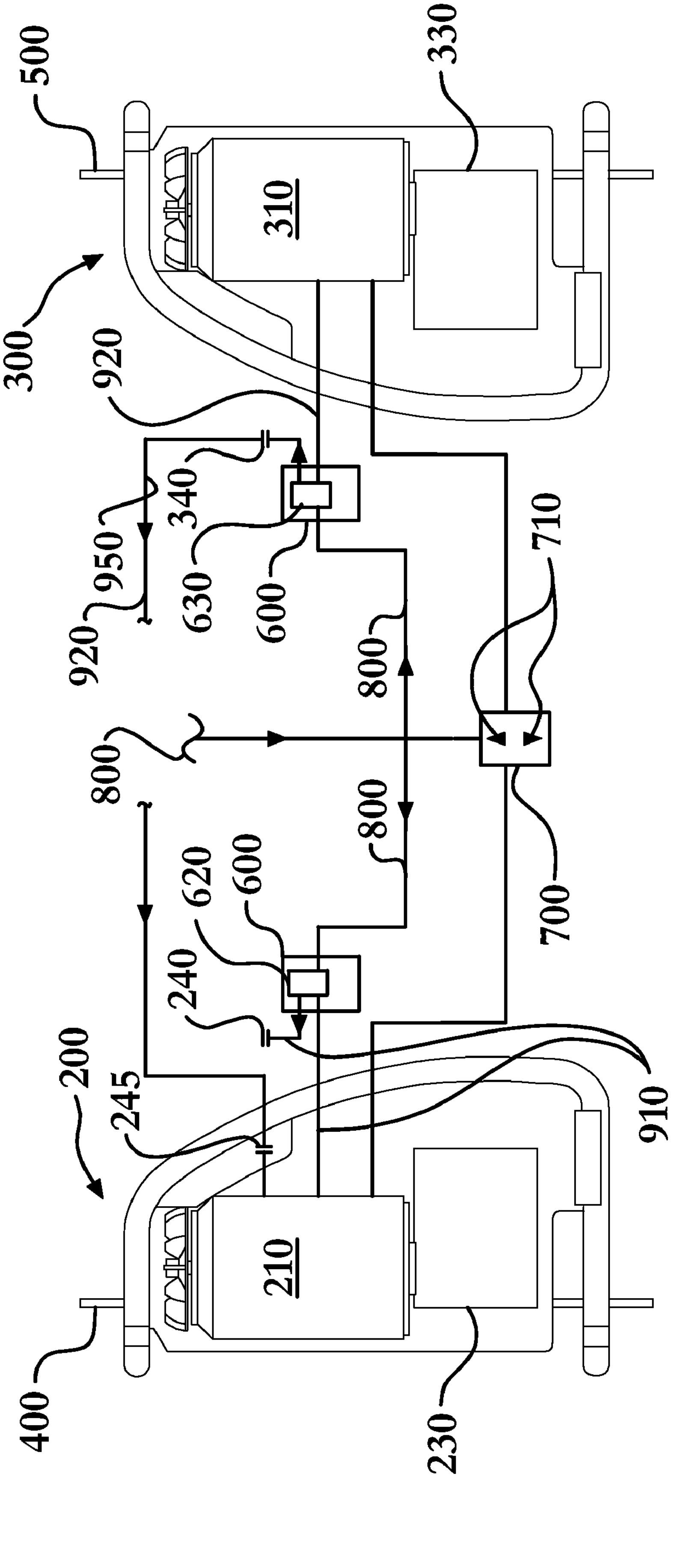
FIG. 9 is a schematic of the suspension work platform hoist system of the present invention, not to scale.
Figure 10:
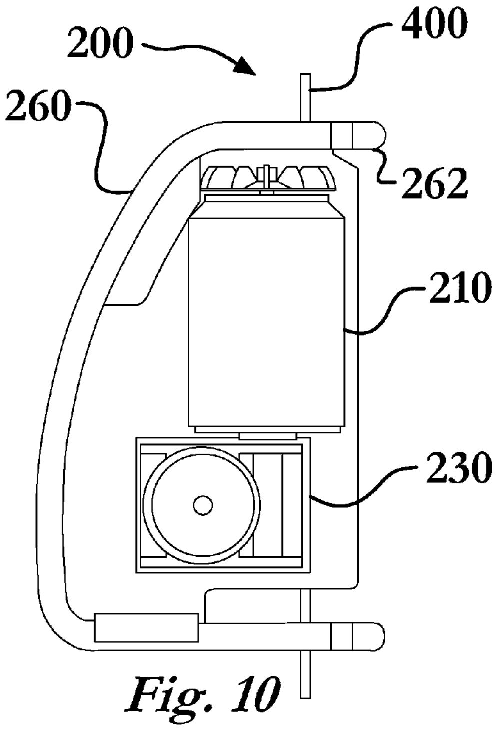
FIG. 10 is a left side elevation view of a hoist of the present invention, not to scale.

Now, referring back to the embodiment of FIGS. 7-9 wherein each drive (620, 630) is sized to power both motors (210, 310), this embodiment is similar to the previously described embodiment of FIG. 2 wherein a single variable frequency drive (610) controls both motors (210, 310), yet the present embodiment introduces redundant capabilities not previously seen. In this embodiment the constant frequency input power source (800) is in electrical communication with both the sinistral variable frequency drive (620), thereby producing a sinistral variable frequency power supply (910), and the dextral variable frequency drive (630), thereby producing a dextral variable frequency power supply (920). The sinistral variable frequency power supply (910) is in electrical communication with the sinistral motor (210) and a dextral output power terminal (240). Similarly, the dextral variable frequency power supply (920) is in electrical communication with the dextral motor (310) and a sinistral output power terminal (340).

Additionally, in this embodiment the sinistral motor (210) is also in electrical communication with a sinistral auxiliary input power terminal (245) and the dextral motor (310) is also in electrical communication with a dextral auxiliary input power terminal (345), as seen schematically in FIG. 7. Therefore, in the configuration of FIG. 8 the variable acceleration motor control system (600) utilizes the sinistral variable frequency drive (620) to control both the sinistral and dextral motors (210, 310), thereby requiring that the dextral output power terminal (240) be in electrical communication with the dextral auxiliary input power terminal (345) via an auxiliary conductor (950). In the alternative configuration of FIG. 9 the variable acceleration motor control system (600) utilizes the dextral variable frequency drive (620) to control both the sinistral and dextral motors (210, 310), thereby requiring that the sinistral output power terminal (340) be in electrical communication with the sinistral auxiliary input power terminal (245) via an auxiliary conductor (950). The auxiliary conductor (950) may be a set of loose conductors or the conductors may be permanently attached to the work platform (100). These embodiments provide the hoist system (10) with a field configurable redundant output power supply capable of controlling the acceleration of the work platform (100) upon failure of either the sinistral variable frequency drive (620) of the dextral variable frequency drive (630).

A further variation of the above embodiment incorporates an alternator that ensures that each time the work platform (100) starts, the opposite variable frequency drive (620, 630) supplies the variable frequency power supply to both motors (210, 310). Alternatively, the alternator may cycle the variable frequency drives (620, 630) based upon the amount of operating time of the drives (620, 630). These embodiments ensure substantially equal wear and tear on the variable frequency drives (620, 630). Still further, the system (10) may incorporate an automatic changeover features so that if one variable frequency drive (620, 630) fails then the other variable frequency drive (620, 630) automatically takes over. As an additional safety measure, the variable frequency drives (610, 620, 630) may incorporate a bypass switch allowing the constant frequency input power source to be directly supplied to the sinistral motor (210) and the dextral motor (310), thereby permitting the variable frequency drives (610, 620, 630) to serve as across-the-line motor starters.

Figure 14:
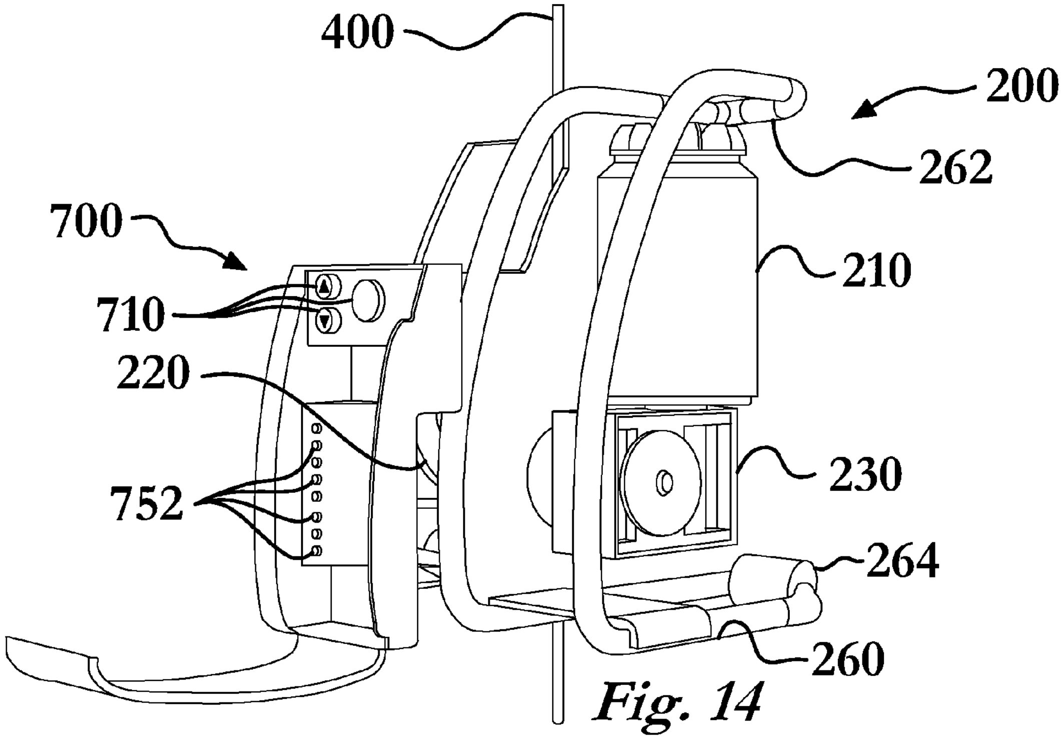
FIG. 14 is a perspective assembly view of a hoist of the present invention, not to scale.
Figure 15:
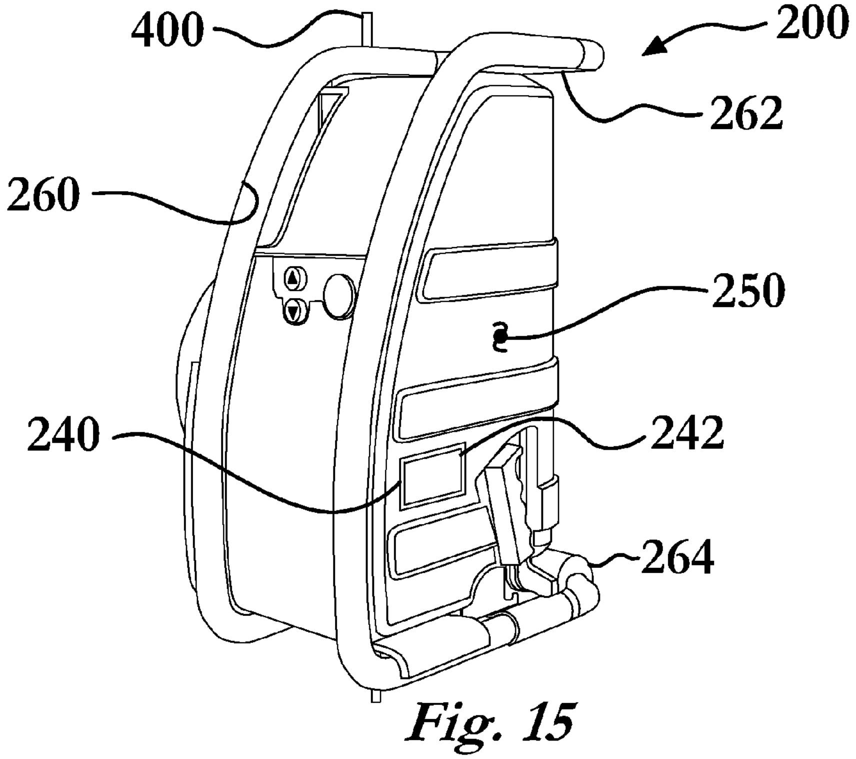
FIG. 15 is a perspective view of a hoist of the present invention.

The present invention may also incorporate enclosures for the hoist components thereby improving the operating safety, equipment life, serviceability, and overall ruggedness. For instance, in one embodiment, seen in FIG. 15, the sinistral motor (210), the sinistral traction mechanism (220), and the sinistral gearbox (230), seen in FIG. 14, are totally enclosed in a sinistral housing (250) attached to a sinistral chassis (260). Similarly, the dextral motor (310), the dextral traction mechanism (320), and the dextral gearbox (330) may be totally enclosed in a dextral housing (350) attached to a dextral chassis (360). Further, with reference now to FIG. 14, the sinistral chassis (260) may include a sinistral handle (262) and at least one rotably mounted sinistral roller (264) configured such that the sinistral hoist (200) pivots about the sinistral roller (264) when the sinistral handle (262) is acted upon, so that the sinistral hoist (200) may be easily transported via rolling motion. Similarly, the dextral chassis (360) may include a dextral handle (362) and at least one rotably mounted dextral roller (364) configured such that the dextral hoist (300) pivots about the dextral roller (364) when the dextral handle (362) is acted upon, so that the dextral hoist (300) may be easily transported via rolling motion. Further, it is often desirable to have very compact hoists (200, 300) so that they may fit through small opening in confined spaces to carry out work. One such occasion is when performing work on the inside of an industrial boiler wherein the access hatches are generally eighteen inches in diameter. Therefore, in one embodiment, seen in FIGS. 14-15, the sinistral hoist (200), sinistral housing (250), and sinistral chassis (260) are configured to pass through an eighteen inch diameter opening and the dextral hoist (300), dextral housing (350), and dextral chassis (360) are configured to pass through an eighteen inch diameter opening.

As previously mentioned, the variable acceleration motor control system (600) is releasably attached to the moving work platform (100). In the embodiments incorporating variable frequency drives (610, 620, 630) and hoist housings (250, 350), the variable frequency drives (610, 620, 630) are most commonly mounted within one, or more, of the hoist housings (250, 350). In fact, in a preferred embodiment the sinistral hoist (200) has its own sinistral variable frequency drive (620) housed within the sinistral hoist housing (250), and similarly the dextral hoist (300) has its own dextral variable frequency drive (630) housed within the dextral hoist housing (350). In such an embodiment, seen in FIG. 15, it is also ideal to have the dextral power terminal (240) as a dextral weather-tight conductor connector (242) located on the sinistral hoist (200), and the sinistral power terminal (340) as a sinistral weather-tight conductor connector (342) located on the dextral hoist (300). The weather-tight conductor connectors (242, 342) and power terminals (240, 340) may be any number of male, or female, industrial plugs and receptacles that cooperate with conductors sized to handle the electrical load of supplying power to either of the motors (210, 310).

In yet another embodiment, the variable acceleration motor control system (600) monitors the constant frequency input power source and blocks electrical communication to the sinistral motor (210) and the dextral motor (310) when the voltage of the constant frequency input power source varies from a predetermined voltage by more than plus, or minus, at least ten percent of the predetermined voltage. Further, the variable acceleration motor control system (600) may incorporate reporting devices to signal to an operator the reason that the system (600) has been shut down. The variable acceleration motor control system (600) may also monitor the load on the sinistral traction mechanism (220) and the dextral traction mechanism (320) and blocks electrical communication to the sinistral motor (210) and the dextral motor (310) if (a) either the sinistral traction mechanism (220) loses traction on the sinistral rope (400) or the dextral traction mechanism (320) loses traction on the dextral rope (500), (b) the load on the work platform (100) exceeds a predetermined value, or (c) the load on the work platform (100) is less than a predetermined value.

The platform control system (700) and the user input device (710) may incorporate functions other than merely accepting instructions to raise or lower the work platform (100). Generally the industry refers to the platform control system (700) as a central control box, which has numerous buttons and switches, or user input devices (710), for controlling the suspension work platform hoist system (10). In most applications the platform control system (700) includes a pendant so that the operator does not need to be located at the user input device (710) to control the movement of the work platform (100). In other words, the user input device (710) may be at least one control switch, button, or toggle located on a fixed central control box or it may be all, or some, of those same devices located on a movable pendent. Generally, the user input device (710) will include up/down hold-to-run switches, hoist selector switches (sinistral, dextral, both), and an emergency stop button. Various embodiments of the present invention may call for the addition of input devices associated with the variable acceleration motor control system (600). Such additional input devices may include (a) approach mode enable/disable, (b) adjustable approach velocity setpoint, (c) work mode enable/disable, (d) adjustable approach velocity setpoint, (e) adjustable acceleration period setpoint, and (f) hoist master/slave selector to identify which hoist generates the control power or control signal and which merely receives the power or control signal and responds accordingly. The platform control system (700) and/or the user input device (720) may incorporate a LCD screen to view diagnostics and setpoints. Further, the LCD screen may be a touch-screen input system.

Even further, the platform control system (700) may incorporate a diagnostic system (750), as seen in FIG. 1, that allows the user to perform specific tests of the system (10) and makes the user aware of certain conditions, and that performs a predetermined set of tests automatically. The diagnostic system (750) permits the user to initiate system tests, or checks, including testing the panel light integrity as well as the level of the input voltage. Further, the diagnostic system (750) may run automatic system tests including (a) ultra-high top limit detection, (b) tilt sensing in up to 4 axes, (c) ultra-bottom limit detection, (d) under load detection, (e) overload detection, (f) fall protection interlock integrity, or Sky Lock interlock integrity, (g) motor temperature, (h) brake voltage level, (i) rope jam sensing, (j) wire-winders integrity, (k) main voltage phase loss integrity, (l) end-of-rope sensing integrity, (m) digital speed read-out, (n) digital fault display, (o) rope diameter sensing integrity, and/or (p) platform height protector integrity. In other words, the diagnostic system (750) may run automatic tests to ensure that every safety feature is operational and properly functioning. The diagnostic system (750) automatic tests may be programmed to run every time the hoist is operated, or on an alternative schedule. The diagnostic system (750) may include any number of visual indicators (752), seen in FIG. 14, to alert the user of particular conditions. For instance, each of the above listed automatic tests may have a unique visual indicator (752) to inform the user whether the test was a success, or failure. The visual indicators (752) may be light emitting diodes, or LED's.

Another advantage of the present platform control system (700) is that it incorporates a printed circuit board (PCB), thereby offering functionality and flexibility not previously seen in hoist system. The PCB facilitates the easy incorporation of numerous optional features by simply plugging them into the appropriate ports on the PCB allowing an unprecedented degree of modularity. The control system software includes plug-and-play type features that automatically recognize new components plugged into the PCB. The substrate of the PCB is an insulating and non-flexible material. The thin wires are visible on the surface of the board are part of a copper foil that initially covered the whole board. In the manufacturing process the copper foil is partly etched away, and the remaining copper forms a network of thin wires. These wires are referred to as the conductor pattern and provide the electrical connections between the components mounted on the PCB. To fasten the modular components to the PCB the legs on the modular components are generally are soldered to the conductor pattern or mounted on the board with the use of a socket. The socket is soldered to the board while the component can be inserted and taken out of the socket without the use of solder. In one embodiment the socket is a ZIF (Zero Insertion Force) socket, thereby allowing the component to be inserted easily in place, and be removable. A lever on the side of the socket is used to fasten the component after it is inserted. If the optional feature to be incorporated requires its own PCB, it may connect to the main PCB using an edge connector. The edge connector consists of small uncovered pads of copper located along one side of the PCB. These copper pads are actually part of the conductor pattern on the PCB. The edge connector on one PCB is inserted into a matching connector (often referred to as a Slot) on the other PCB. The modular components mentioned in this paragraph may include a GPS tracking device (720) and a wireless receiver (740), just to name a few.

The platform control system (700) may further include a GPS tracking device (720), shown schematically in FIG. 1. The GPS tracking device (720) allows the owner of the suspension work platform hoist system (10) to track its location real-time. The GPS tracking device (720) may be a battery powered 12, or more, channel GPS system capable of up to 120 days of operation based upon 10 reports a day, powered by 6 AA alkaline batteries or 6-40 VDC. The GPS tracking device (720) has an internal antenna and memory to record transmissions when cellular service is poor or lost. The GPS tracking device (720) may be motion activated. The GPS tracking device (720) may be manufactured by UTrak, Inc., a Miniature Covert GPS Tracking System Item#: SVGPS100, a RigTracker tracking system, or a Laipac Technology, Inc. tracking system, just to name a few.

Further, still referring to FIG. 1, the platform control system (700) may include a remote wireless transmitter (730) and a receiver (740) wherein the remote wireless transmitter (730) transmits commands to the receiver (740) using spread spectrum communications. The remote wireless transmitter (730) may include some, or all, of the controls of the user input device(s) (710) discussed herein. The spread spectrum communications may utilize digital frequency hopping or analog continuous frequency variation, generally on 900 MHz to 2.4 GHz carrier frequencies. Additionally, the remote wireless transmitter (730) is capable of transmitting commands to the receiver (740) with a range of at least one thousand feet, and up to three thousand feet. Spread spectrum communications are less susceptible to interference, interception, exploitation, and spoofing than conventional wireless signals. This is important due to the safety concerns associated with controlling a suspended work platform (100) from a remote location. The spread spectrum communication system varies the frequency of the transmitted signal over a large segment of the electromagnetic radiation spectrum, often referred to as noise-like signals. The frequency variation is done according to a specific, but complicated, mathematical function often referred to as spreading codes, pseudo-random codes, or pseudo-noise codes. The transmitted frequency changes abruptly many times each second. The spread spectrum signals transmit at a much lower spectral power density (Watts per Hertz) than narrowband transmitters.

The variable frequency drives (610, 620, 630) discussed herein control the speed, torque, direction, and resulting horsepower of the sinistral motor (210) and the dextral motor (310). The variable frequency drives (610, 620, 630) may be of the voltage-source inverter (VSI) type or current-source inverter (CSI) type. The variable frequency drives (610, 620, 630) may incorporate silicon control rectifier (SCR) technology, insulated gate bipolar transistors (IGBT), or pulse-width-modulation (PWM) technology. The variable frequency drives (610, 620, 630) provide soft-start capability that decreases electrical stresses and line voltage sags associated with full voltage motor starts.

The variable frequency drives (610, 620, 630) current ratings shall be 4 kHz or 8 kHz carrier frequency. The variable frequency drives (610, 620, 630) may automatically reduce the carrier frequency as load is increased. The variable frequency drives (610, 620, 630) may incorporate manual stop/start, speed control, local/remote status indication, manual or automatic speed control selection, and run/jog selection. Additionally, the variable frequency drives (610, 620, 630) may incorporates a command center to serve as a means to configure controller parameters such as Minimum Speed, Maximum Speed, Acceleration and Deceleration times, Volts/Hz ratio, Torque Boost, Slip Compensation, Overfrequency Limit, and Current Limit. The variable frequency drives (610, 620, 630) may include an LED display mounted on the door of the cabinet that digitally indicates frequency output, voltage output, current output, motor RPM, input kW, elapsed time, time-stamped fault indication, and/or DC Bus Volts. The variable frequency drives (610, 620, 630) includes multiple programmable preset speeds which will force the variable frequency drives (610, 620, 630) to a preset speed upon a user contact closure. Further, the variable frequency drives (610, 620, 630) may include an isolated electrical follower capability to enable it to follow a 0-20 mA, 4-20 mA or 0-4, 0-8, 0-10 volt DC grounded or ungrounded speed signal. Additionally, the variable frequency drives (610, 620, 630) may provide isolated 0-10 V or 4-20 ma output signals for computer controlled feedback signals that are selectable for speed or current. The variable frequency drives (610, 620, 630) may include the following protective features: output phase-to-phase short circuit condition, total ground fault under any operating condition, high input line voltage, low input line voltage, and/or loss of input or output phase. The variable frequency drives (610, 620, 630) shall provide variable acceleration and deceleration periods of between 0.1 and 999.9 seconds. The variable frequency drives (610, 620, 630) is capable of continuous operation at an ambient temperature of 0° C. to 40° C.

The traction mechanisms (220, 320) discussed herein are designed to grip the respective ropes (400, 500) and may be of the solid sheave type, which are known in the art and are currently available via Sky Climber, Inc. of Stone Mountain, Ga. Further, the gearboxes (230, 330) are planetary and worm gear systems designed to reduce the rotational speed of the motors (210, 310) to a usable speed. One with skill in the art will appreciate that other gear systems may be incorporated in the gearboxes (210, 310). Additionally, the power terminals (240, 245, 340, 345) discussed herein can take virtually any form that facilitate the establishment of electrical communication between the terminal and a conductor. While the disclosure herein refers to two hoists, namely the sinistral hoist (200) and the dextral hoist (300), one with skill in the art will appreciate that the suspension work platform hoist system (10) of the present invention may incorporate a single hoist or more than two hoists. Similarly, while the present description focuses on a single rope (400, 500) per hoist (200, 300), one with skill in the art will appreciate that the present invention also covers applications that require multiple ropes for each hoist, as is common in Europe.

Each of the housings (250, 350) may include separate compartments for housing the controls and electronics. Generally, the electronic components used in the system (10) must be maintained within a given ambient temperature range, thus it is convenient to house all such components in a temperature controlled environment. The temperature of the electronics compartment may be maintained using any number of conventional temperature maintenance methods commonly known by those with skill in the art. Alternatively, the compartment may be coated with an altered carbon molecule based coating that serves to maintain the compartment at a predetermined temperature and reduce radiation.

Figure 17:
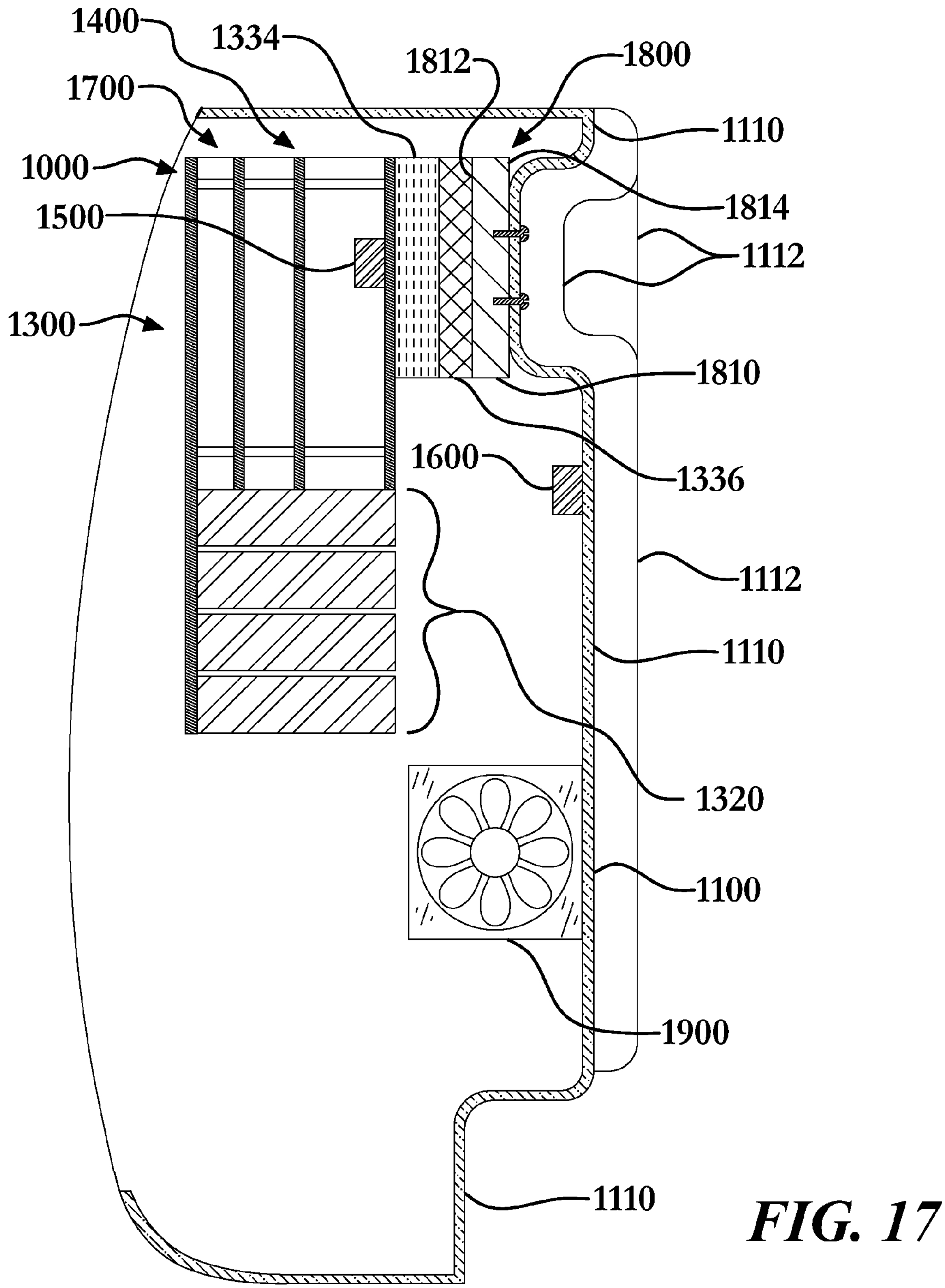
FIG. 17 is a left side sectional view of a powered controlled acceleration work platform hoist control cooling system.

The powered controlled acceleration suspension work platform hoist control cooling system (1000) of FIG. 17 is housed in a sealed control enclosure (1100) that is formed with a plurality of enclosure sidewalls (1110). The hoist control cooling system (1000) is in electrical communication with a constant frequency input power source (800) and a hoist motor (1200). The sealed enclosure does not have to be absolutely sealed, and may be rated as low as, but not limited to, NEMA type 3, which are dust and weather resistant and suitable for outdoor applications. For instance, with reference to FIG. 14, in one embodiment the platform control system (700) is the sealed control enclosure (1100) containing the control electronics including a variable frequency drive (1300), separate from the portion of the housing (250) that contains the actual hoist motor (210). While the hoist motor (210) does need cooling, this is may be accomplished through the use of a fan cooled motor, whereas the cooling of the control system must be accomplished in a more sensitive manner to avoid contamination of the controls from high moisture content air from the surrounding environment, as well as high particulate content air from the surrounding environment.

Figure 18:
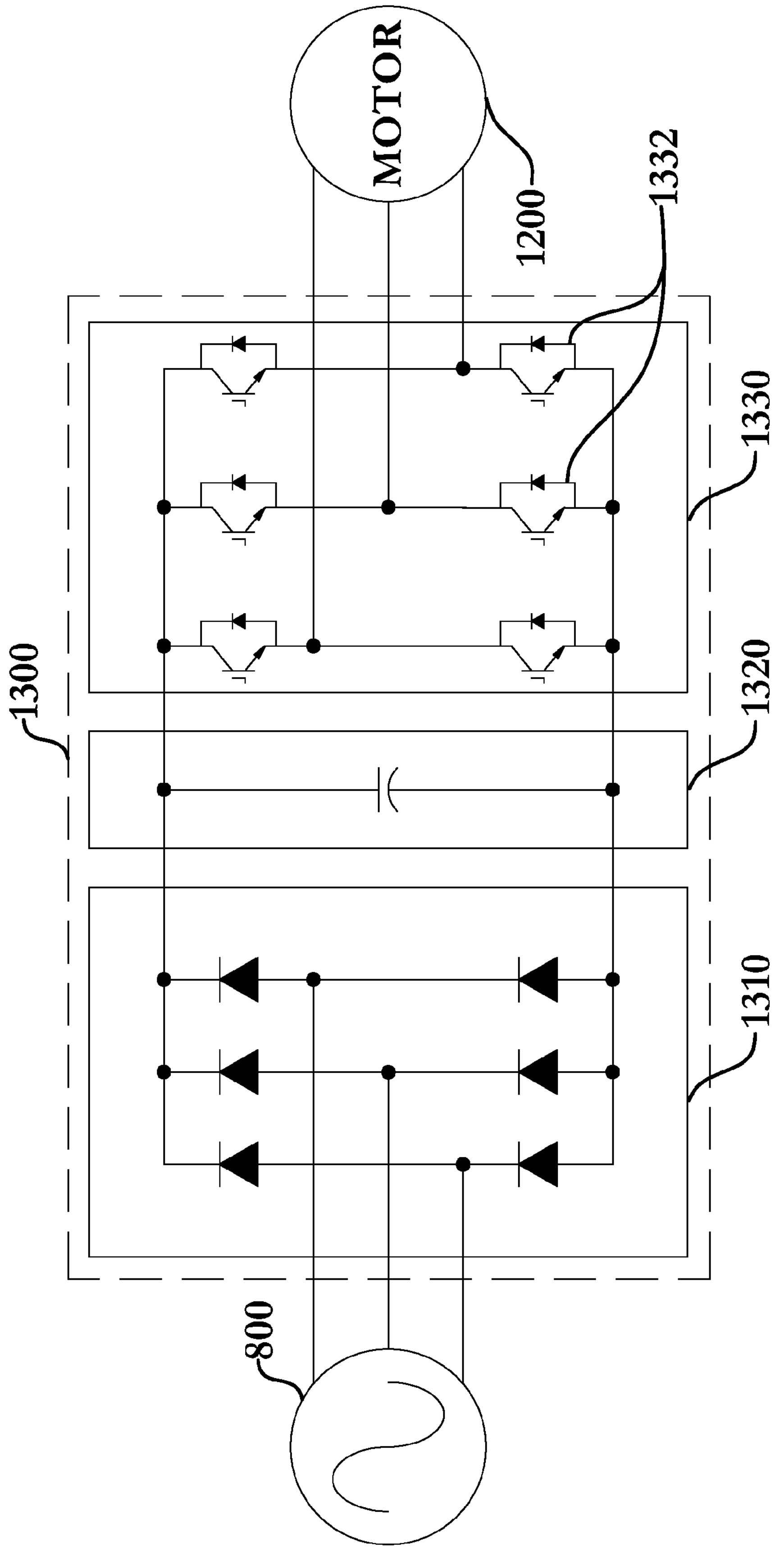
FIG. 18 is a schematic of a variable frequency drive.

The hoist control cooling system (1000) is comprised of a variable frequency drive (1300) of FIG. 18 in electrical communication with the constant frequency input power source (800), includes a rectifier (1310), a dc bus (1320), and an inverter (1330). The rectifier (1310) converts the constant frequency input power source (800) into direct current (dc) power.

The dc bus (1320) receives the direct current power from the rectifier (1310) and stores the direct current power in the dc bus (1320) capacitor bank, which provides extra power for the inverter (1330) during times of high current load. In addition to storing dc power, the dc bus (1320) filters and smoothes the incoming pulsed (dc) current, providing the inverter (1330) with a clean dc power source. The dc bus (1320) may contain inductors that conduct dc current, but block ac current, in order to further smooth the power going to the inverter (1330).

The inverter (1330) provides control for power acceleration and deceleration of the work platform. Traditional systems, however, offer no control over a powered deceleration of the work platform. This is particularly problematic when trying to stop the work platform at a particular elevation since the platform approaches the elevation at full speed and then stops instantaneously. This crude level of control offered by traditional systems results in repeated starting, stopping, and reversing, or "hunting," before the desired elevation is obtained. Such repeated starts and stops not only prematurely wear the equipment, but are dangerous to the work platform occupants.

The inverter (1330) contains electronic switching devices such as, but not limited to: Bipolar Junction Transistors (BJT), "Insulated Gate Bipolar Transistors" (IGBTs), "Silicon Control Rectifiers" (SCRs), and or Metal Oxide Semiconductor Field Effect Transistors. The electronic switching devices allows precision control of the power being delivered to the hoist motor (1200) of FIG. 19. Such precise control may be through the use of "pulse width modulation" (PWM). Pulse width modulation is achieved by switching the power on and off at precise intervals to simulate a current sine wave being delivered to the hoist motor (1200). Varying the frequency delivered to the hoist motor (1200) determines the hoist motors (1200) speed.

The variable frequency drive (1300), however, generates substantial heat during usage. Further compounding the heat generation issue is the fact that it is desirable to minimize the space required for the sealed control enclosure (1100). In addition, to the heat generated by the variable frequency drive (1300), further heat build up may result with use in extreme environments such as commonly found in Saudi Arabia Allowing the internal temperature of the sealed control enclosure (1100) to increase in an uncontrolled manner would result in a variable frequency drive (1300) electrical component failure. As such, a cooling system (1400), as seen in FIG. 17, is required to keep the variable frequency drive (1300) within operating parameters. The cooling system (1400) includes an inverter temperature sensor (1500), an ambient temperature sensor (1600), a cooling system controller (1700), an inverter cooler (1800), and an ambient cooler (1900). The inverter temperature sensor (1500) measures the temperature of the inverter (1330) and generates an inverter temperature signal. The ambient temperature sensor (1600) measures the temperature of the ambient air in the sealed control enclosure (1100) and generates an ambient temperature signal.

The cooling system controller (1700) communicates with the inverter temperature sensor (1500) and the ambient temperature sensor (1600) by receiving the inverter temperature signal, the ambient temperature signal, and generating both an inverter cooling signal, and an ambient cooling signal. The inverter cooling signal controls the cooling of the inverter (1330). Similarly, an ambient cooling signal switches the ambient cooler (1900) on, thereby cooling the ambient air temperature in the sealed control enclosure (1100).

The inverter cooler (1800) is in physical contact with at least a portion of inverter (1330) and in physical contact with a portion of one of the plurality of enclosure sidewalls (1110). The inverter cooler (1800) communicates with the cooling system controller (1700) which controls the amount of heat that the inverter cooler (1800) removes from the inverter (1330) and rejects to the enclosure sidewall (1110).

The ambient cooler (1900) is also located within the sealed control enclosure (1100) and receives the ambient cooling signal from the cooling system controller (1700). The ambient cooling signal controls the amount of heat that the ambient cooler (1900) removes from the control enclosure (1100).

In one particular embodiment, the inverter (1330) includes a plurality of insulated gate bipolar transistors (1332), seen in FIG. 18, to control the discharge of the power to the hoist motor (1200). In this embodiment the insulated gate bipolar transistors (1332) are the leading generator of heat within the sealed control enclosure (1100). In one particular embodiment the plurality of insulated gate bipolar transistors (1332) are located on an IGBT board (1334), seen in FIG. 17, and the inverter cooler (1800) is in physical contact with at least a portion of the IGBT board (1334) to remove a portion of the heat generated by the insulated gate bipolar transistors (1332). The direct physical contact of the inverter cooler (1800) with a portion of the IGBT board (1334) in this embodiment facilitates efficient heat removal directly from the IGBT board (1334) and minimizes the amount of heat radiated into the sealed control enclosure (1100), thereby reducing the elevation of temperature in the sealed control enclosure (1100) and extending the life of the electronics housed therein.

In yet a further embodiment, the IGBT board (1334) may be in physical contact with an IGBT cooling plate (1336), and the inverter cooler (1800) may be in physical contact with at least a portion of the IGBT cooling plate (1336) which removes a portion of the heat generated by the insulated gate bipolar transistors (1332). The IGBT cooling plate (1336) serves to facilitate the heat removal from the IGBT board (1334), which may have complex and irregular surfaces, to the inverter cooler (1800), further minimizing the likelihood of temperature escalation within the sealed control enclosure (1100). The IGBT cooling plate (1336) may be constructed of any thermally conductive material.

One skilled in the art will appreciate that a number of different cooling methodologies may be incorporated in the inverter cooler (1800) including, but not limited to, heat pipes, heat pumps, various heat sinks including active heat sinks, liquid cooling, boiling heat transfer, thermocapillary devices, conduction, natural convection, forced convection, refrigerant based systems, air jet impingement, vortex generators, micro-channel cooling, immersion cooling, spray cooling, thermosyphon systems, synthetic jet air cooling, and ionic wind engines.

One of the many possible inverter cooler (1800) embodiments incorporates a thermoelectric cooling device, specifically a Peltier thermoelectric cooling device (1810) having a cold side (1812) and a hot side (1814), and wherein a portion of the cold side (1812) is in contact with at least a portion of inverter (1330), and a portion of the hot side (1814) is in contact with at least a portion of one of the plurality of enclosure sidewalls (1110). In this embodiment the inverter cooling signal controls the amount of power flowing to the inverter cooler (1800), thereby varying the cooling of the inverter (1330). Furthermore, the inverter cooler (1800) may be a Peltier thermoelectric cooling device (1810) that includes a conduction heat transfer device (2000) in contact with at least a portion of one of the plurality of enclosure sidewalls (1110) and a portion of the hot side (1814). The conduction heat transfer device (2000) may be a conductive heat transfer layer to ensure complete contact between the components, thereby maximizing the amount of conductive heat transfer across surface interfaces that are not perfectly smooth.

Additionally, the cooling system controller (1700) may generate a high-level alarm signal if the ambient temperature sensor (1600) detects the temperature above an alarm limit temperature. The high-level alarm signal is used to stop the operation of the hoist motor (1200) and protect the sensitive controls housed in the sealed control enclosure (1100). The alarm limit temperature may be adjustable, but should not exceed the maximum temperature rating of the variable frequency drive. In one particular embodiment the ambient cooler (1900) is activated at 100 degrees Fahrenheit.

In yet another embodiment, aimed at improving the efficiency of heat removal from the sealed control enclosure (1100), one or more of the plurality of enclosure sidewalls (1110) formed with a plurality of external convective fins (1112), seen in FIG. 17, adjacent to the location that the inverter cooler (1800) which is in physical contact with at least one of the same plurality of enclosure sidewalls (1110).

Figure 19:
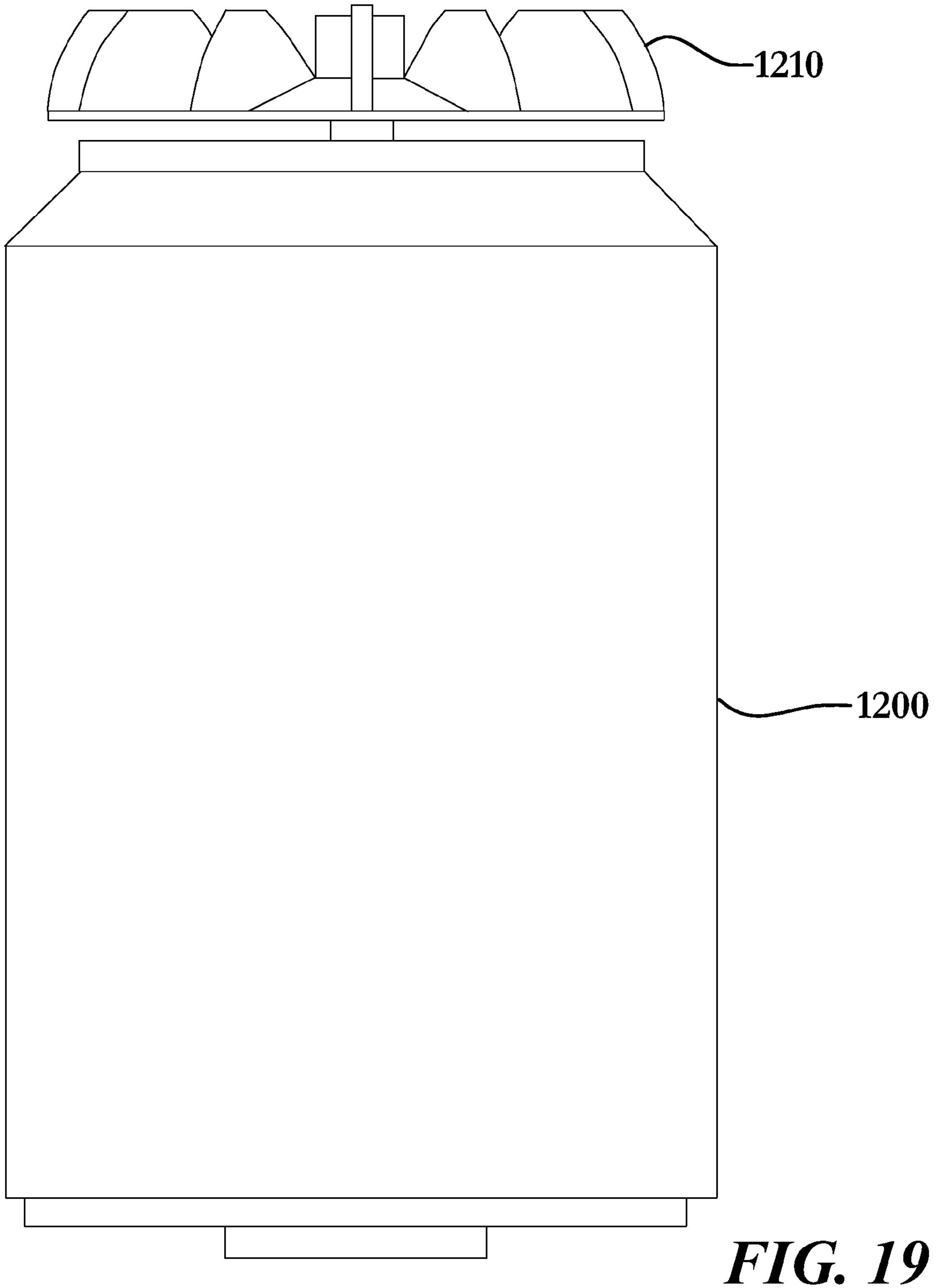
FIG. 19 is a front elevation view of a hoist motor and motor fan.

Furthermore, the hoist motor (1200) of FIG. 19 may be a fan cooled motor having a motor fan (1210) to circulate air over the hoist motor (1200). Additionally, in the previously described embodiment incorporating the plurality of external convective fins (1112), the motor fan (1210) may secondarily circulate air past the plurality of external convective fins (1112).

As previously explained, the number of variable frequency drives in the system may vary. For instance, in one embodiment each individual hoist may have its own variable frequency drive located in a sealed control enclosure (1100) that is part of the individual hoist housing. Alternatively, multiple hoists may be configured in a master and slave type of control arrangement, thereby allowing a single variable frequency drive to control multiple hoist motors. Further, in yet another embodiment each variable frequency drive may be located remotely from the associated hoist motor(s), such as in a platform control system (700), or central control box, as previously explained. One skilled in the art will understand that whether the variable frequency drive, or drives, are located at the individual hoists or at a central control location; the variable frequency drive will be located in a sealed control enclosure (1100) and an inverter cooler (1800) will be in physical contact with at least a portion of the inverter (1330) and a portion of one of the plurality of enclosure sidewalls (1110). Thus, all of the previously described embodiments and variations apply equally to embodiments in which the variable frequency drive is located remotely from the hoist motor, and therefore will not be repeated here.

Numerous alterations, modifications, and variations of the preferred embodiments disclosed herein will be apparent to those skilled in the art and they are all anticipated and contemplated to be within the spirit and scope of the instant invention. For example, although specific embodiments have been described in detail, those with skill in the art will understand that the preceding embodiments and variations can be modified to incorporate various types of substitute and or additional or alternative materials, relative arrangement of elements, and dimensional configurations. Accordingly, even though only few variations of the present invention are described herein, it is to be understood that the practice of such additional modifications and variations and the equivalents thereof, are within the spirit and scope of the invention as defined in the following claims. The corresponding structures, materials, acts, and equivalents of all means or step plus function elements in the claims below are intended to include any structure, material, or acts for performing the functions in combination with other claimed elements as specifically claimed.

We claim:

1. A powered controlled acceleration suspension work platform hoist control cooling system (1000) housed in a sealed control enclosure (1100) formed of a plurality of enclosure sidewalls (1110), wherein the hoist control cooling system (1000) is in electrical communication with a constant frequency input power source (800) and a hoist motor (1200), comprising:

(A) a variable frequency drive (1300) in electrical communication with the constant frequency input power source (800), and having a rectifier (1310), a dc bus (1320), and an inverter (1330), wherein (1) the rectifier (1310) converts the constant frequency input power source (800) into direct current power;

(2) the dc bus (1320) receives the direct current power from the rectifier (1310) stores the direct current power;

(3) the inverter (1330) controls the discharge of the direct current power from the dc bus (1320) to the hoist motor (1200);

(B) a cooling system (1400) in electrical communication with the constant frequency input power source (800), wherein the cooling system (1400) includes:

(1) an inverter temperature sensor (1500) measuring a temperature of the inverter (1330) and generating an inverter temperature signal;

(2) an ambient temperature sensor (1600) measuring a temperature of the ambient air in the sealed control enclosure (1100) and generating an ambient temperature signal;

(3) a cooling system controller (1700) in communication with the inverter temperature sensor (1500) and the ambient temperature sensor (1600), wherein the cooling system controller (1700) receives the inverter temperature signal and the ambient temperature signal and generates an inverter cooling signal and an ambient cooling signal;

(4) an inverter cooler (1800) in physical contact with at least a portion of inverter (1330) and a portion of one of the plurality of enclosure sidewalls (1110), the inverter cooler (1800) in communication with the cooling system controller (1700) to receive the inverter cooling signal, wherein the amount of heat that the inverter cooler (1800) removes from the inverter (1330) and rejects to the enclosure sidewall (1110) is controlled by the inverter cooling signal; and (5) an ambient cooler (1900) in the sealed control enclosure (1100) and in communication with the cooling system controller (1700) to receive the ambient cooling signal, wherein the amount of heat that the ambient cooler (1900) removes from the control enclosure (1100) is controlled by the ambient cooling signal.

2. The powered controlled acceleration suspension work platform hoist control cooling system (1000) of claim 1, wherein the inverter (1330) includes a plurality of insulated gate bipolar transistors (1332) to control the discharge of the power to the hoist motor (1200), wherein the plurality of insulated gate bipolar transistors (1332) are located on an IGBT board (1334), and the inverter cooler (1800) is in physical contact with at least a portion of the IGBT board (1334) to remove a portion of the heat generated by the insulated gate bipolar transistors (1332).

3. The powered controlled acceleration suspension work platform hoist control cooling system (1000) of claim 2, wherein the IGBT board (1334) further includes an IGBT cooling plate (1336), and the inverter cooler (1800) is in physical contact with at least a portion of the IGBT cooling plate (1336) to remove a portion of the heat generated by the insulated gate bipolar transistors (1332).

4. The powered controlled acceleration suspension work platform hoist control cooling system (1000) of claim 1, wherein the inverter cooler (1800) is a Peltier thermoelectric cooling device (1810) having a cold side (1812) and a hot side (1814), and wherein a portion of the cold side (1812) is in contact with at least a portion of inverter (1330), and a portion of the hot side (1814) is in contact with at least a portion of one of the plurality of enclosure sidewalls (1110).

5. The powered controlled acceleration suspension work platform hoist control cooling system (1000) of claim 4, further including a conduction heat transfer device (2000) in contact with at least a portion of one of the plurality of enclosure sidewalls (1110) and a portion of the hot side (1814).

6. The powered controlled acceleration suspension work platform hoist control cooling system (1000) of claim 1, wherein the cooling system controller (1700) further generates a high-level alarm signal if the ambient temperature sensor (1600) detects the temperature above an alarm limit temperature, and prevents operation of the hoist motor (1200).

7. The powered controlled acceleration suspension work platform hoist control cooling system (1000) of claim 1, wherein at least one of the plurality of enclosure sidewalls (1110) is formed with a plurality of external convective fins (1112) adjacent to the location that the inverter cooler (1800) is in physical contact with the same at least one of the plurality of enclosure sidewalls (1110) to further improve the transfer of heat from the inverter (1330) to the environment external to the sealed control enclosure (1100).

8. The powered controlled acceleration suspension work platform hoist control cooling system (1000) of claim 7, wherein the hoist motor (1200) includes a motor fan (1210), and the motor fan (1210) moves air over the hoist motor (1200) and the plurality of external convective fins (1112).

9. A powered controlled acceleration suspension work platform hoist control cooling system (1000) housed in a sealed control enclosure (1100) formed of a plurality of enclosure sidewalls (1110), wherein the hoist control cooling system (1000) is in electrical communication with a constant frequency input power source (800) and a hoist motor (1200), comprising:

(A) a variable frequency drive (1300) in electrical communication with the constant frequency input power source (800), and having a rectifier (1310), a dc bus (1320), and an inverter (1330), wherein (1) the rectifier (1310) converts the constant frequency input power source (800) into direct current power;

(2) the dc bus (1320) receives the direct current power from the rectifier (1310) stores the direct current power;

(3) the inverter (1330) includes a plurality of insulated gate bipolar transistors (1332) to control the discharge of the power to the hoist motor (1200), wherein the plurality of insulated gate bipolar transistors (1332) are located on an IGBT board (1334);

(B) a cooling system (1400) in electrical communication with the constant frequency input power source (800), wherein the cooling system (1400) includes:

(1) an inverter temperature sensor (1500) measuring a temperature of the inverter (1330) and generating an inverter temperature signal;

(2) an ambient temperature sensor (1600) measuring a temperature of the ambient air in the sealed control enclosure (1100) and generating an ambient temperature signal;

(3) a cooling system controller (1700) in communication with the inverter temperature sensor (1500) and the ambient temperature sensor (1600), wherein the cooling system controller (1700) receives the inverter temperature signal and the ambient temperature signal and generates an inverter cooling signal and an ambient cooling signal;

(4) an inverter cooler (1800) in physical contact with at least a portion of inverter (1330) and a portion of one of the plurality of enclosure sidewalls (1110), the inverter cooler (1800) in communication with the cooling system controller (1700) to receive the inverter cooling signal, wherein the amount of heat that the inverter cooler (1800) removes from the inverter (1330) and rejects to the enclosure sidewall (1110) is controlled by the inverter cooling signal, wherein the inverter cooler (1800) is in physical contact with at least a portion of the IGBT board (1334) to remove a portion of the heat generated by the insulated gate bipolar transistors (1332); and (5) an ambient cooler (1900) in the sealed control enclosure (1100) and in communication with the cooling system controller (1700) to receive the ambient cooling signal, wherein the amount of heat that the ambient cooler (1900) removes from the control enclosure (1100) is controlled by the ambient cooling signal.

10. The powered controlled acceleration suspension work platform hoist control cooling system (1000) of claim 9, wherein the IGBT board (1334) further includes an IGBT cooling plate (1336), and the inverter cooler (1800) is in physical contact with at least a portion of the IGBT cooling plate (1336) to remove a portion of the heat generated by the insulated gate bipolar transistors (1332).

11. The powered controlled acceleration suspension work platform hoist control cooling system (1000) of claim 9, wherein the inverter cooler (1800) is a Peltier thermoelectric cooling device (1810) having a cold side (1812) and a hot side (1814), and wherein a portion of the cold side (1812) is in contact with at least a portion of inverter (1330), and a portion of the hot side (1814) is in contact with at least a portion of one of the plurality of enclosure sidewalls (1110).

12. The powered controlled acceleration suspension work platform hoist control cooling system (1000) of claim 11, further including a conduction heat transfer device (2000) in contact with at least a portion of one of the plurality of enclosure sidewalls (1110) and a portion of the hot side (1814).

13. The powered controlled acceleration suspension work platform hoist control cooling system (1000) of claim 9, wherein the cooling system controller (1700) further generates a high-level alarm signal if the ambient temperature sensor (1600) detects the temperature above an alarm limit temperature, and prevents operation of the hoist motor (1200).

14. The powered controlled acceleration suspension work platform hoist control cooling system (1000) of claim 9, wherein at least one of the plurality of enclosure sidewalls (1110) is formed with a plurality of external convective fins (1112) adjacent to the location that the inverter cooler (1800) is in physical contact with the same at least one of the plurality of enclosure sidewalls (1110) to further improve the transfer of heat from the inverter (1330) to the environment external to the sealed control enclosure (1100).

15. The powered controlled acceleration suspension work platform hoist control cooling system (1000) of claim 14, wherein the hoist motor (1200) includes a motor fan (1210), and the motor fan (1210) moves air over the hoist motor (1200) and the plurality of external convective fins (1112).

16. A powered controlled acceleration suspension work platform hoist control cooling system (1000) housed in a sealed control enclosure (1100) formed of a plurality of enclosure sidewalls (1110), wherein the hoist control cooling system (1000) is in electrical communication with a constant frequency input power source (800) and a hoist motor (1200), comprising:

(A) a variable frequency drive (1300) in electrical communication with the constant frequency input power source (800), and having a rectifier (1310), a dc bus (1320), and an inverter (1330), wherein (1) the rectifier (1310) converts the constant frequency input power source (800) into direct current power;

(2) the dc bus (1320) receives the direct current power from the rectifier (1310) stores the direct current power;

(3) the inverter (1330) includes a plurality of insulated gate bipolar transistors (1332) to control the discharge of the power to the hoist motor (1200), wherein the plurality of insulated gate bipolar transistors (1332) are located on an IGBT board (1334);

(B) a cooling system (1400) in electrical communication with the constant frequency input power source (800), wherein the cooling system (1400) includes:

(1) an inverter temperature sensor (1500) measuring a temperature of the inverter (1330) and generating an inverter temperature signal;

(2) an ambient temperature sensor (1600) measuring a temperature of the ambient air in the sealed control enclosure (1100) and generating an ambient temperature signal;

(3) a cooling system controller (1700) in communication with the inverter temperature sensor (1500) and the ambient temperature sensor (1600), wherein the cooling system controller (1700) receives the inverter temperature signal and the ambient temperature signal and generates an inverter cooling signal and an ambient cooling signal;

(4) an inverter cooler (1800) in physical contact with at least a portion of inverter (1330) and a portion of one of the plurality of enclosure sidewalls (1110), the inverter cooler (1800) in communication with the cooling system controller (1700) to receive the inverter cooling signal, wherein the amount of heat that the inverter cooler (1800) removes from the inverter (1330) and rejects to the enclosure sidewall (1110) is controlled by the inverter cooling signal, wherein the inverter cooler (1800) is in physical contact with at least a portion of the IGBT board (1334) to remove a portion of the heat generated by the insulated gate bipolar transistors (1332), and wherein the inverter cooler (1800) is a Peltier thermoelectric cooling device (1810) having a cold side (1812) and a hot side (1814), and wherein a portion of the cold side (1812) is in contact with at least a portion of inverter (1330), and a portion of the hot side (1814) is in contact with at least a portion of one of the plurality of enclosure sidewalls (1110); and (5) an ambient cooler (1900) in the sealed control enclosure (1100) and in communication with the cooling system controller (1700) to receive the ambient cooling signal, wherein the amount of heat that the ambient cooler (1900) removes from the control enclosure (1100) is controlled by the ambient cooling signal.

17. The powered controlled acceleration suspension work platform hoist control cooling system (1000) of claim 6, wherein the IGBT board (1334) further includes an IGBT cooling plate (1336), and the inverter cooler (1800) is in physical contact with at least a portion of the IGBT cooling plate (1336) to remove a portion of the heat generated by the insulated gate bipolar transistors (1332).

18. The powered controlled acceleration suspension work platform hoist control cooling system (1000) of claim 16, wherein the cooling system controller (1700) further generates a high-level alarm signal if the ambient temperature sensor (1600) detects the temperature above an alarm limit temperature, and prevents operation of the hoist motor (1200).

19. The powered controlled acceleration suspension work platform hoist control cooling system (1000) of claim 16, wherein at least one of the plurality of enclosure sidewalls (1110) is formed with a plurality of external convective fins (1112) adjacent to the location that the inverter cooler (1800) is in physical contact with the same at least one of the plurality of enclosure sidewalls (1110) to further improve the transfer of heat from the inverter (1330) to the environment external to the sealed control enclosure (1100).

20. The powered controlled acceleration suspension work platform hoist control cooling system (1000) of claim 19, wherein the hoist motor (1200) includes a motor fan (1210), and the motor fan (1210) moves air over the hoist motor (1200) and the plurality of external convective fins (1112).

* * * * *